United States Patent
Kanatzidis et al.

(10) Patent No.: US 10,002,998 B2
(45) Date of Patent: Jun. 19, 2018

(54) TIN SELENIDE SINGLE CRYSTALS FOR THERMOELECTRIC APPLICATIONS

(71) Applicant: Northwestern University, Evanston, IL (US)

(72) Inventors: Mercouri G. Kanatzidis, Wilmette, IL (US); Li-Dong Zhao, Beijing (CN)

(73) Assignee: Northwestern University, Evanston, IL (US)

( * ) Notice: Subject to any disclaimer, the term of this patent is extended or adjusted under 35 U.S.C. 154(b) by 247 days.

(21) Appl. No.: 14/823,738

(22) Filed: Aug. 11, 2015

(65) Prior Publication Data

US 2016/0049568 A1 Feb. 18, 2016

Related U.S. Application Data

(60) Provisional application No. 62/036,736, filed on Aug. 13, 2014.

(51) Int. Cl.
*H02J 7/00* (2006.01)
*H01L 35/16* (2006.01)
*C01B 19/00* (2006.01)

(52) U.S. Cl.
CPC ............ *H01L 35/16* (2013.01); *C01B 19/007* (2013.01)

(58) Field of Classification Search
USPC .................................................. 320/100–108
See application file for complete search history.

(56) References Cited

U.S. PATENT DOCUMENTS

| | | | | |
|---|---|---|---|---|
| 7,847,179 B2 * | 12/2010 | Kanatzidis | .............. | H01L 35/16 136/200 |
| 8,778,214 B2 * | 7/2014 | Kanatzidis | ............ | C01B 19/007 136/239 |
| 2004/0107988 A1 | 6/2004 | Harman et al. | | |
| 2005/0181587 A1 * | 8/2005 | Duan | .................... | B82Y 10/00 438/551 |
| 2011/0073797 A1 | 3/2011 | Kanatzidis et al. | | |
| 2012/0138870 A1 | 6/2012 | Snyder et al. | | |

OTHER PUBLICATIONS

Baumgardner et al., SnSe Nanocrystals: Synthesis, Structure, Optical Properties, and Surface Chemistry, J. Am. Chem. Soc., 132, 2010, pp. 9519-9521.

Chattopadhyay et al., Neutron Diffraction Study of the Structural Phase Transition in SnS and SnSe, J. Phys. Chem. Solids, vol. 47, No. 9,, 1986, pp. 879-885.

Chen et al., Thermoelectric properties of p-type polycrystalline SnSe doped with Ag, J. Mater. Chem. A, 2, May 2, 2014, pp. 11171-11176.

Sassi et al., Assessment of the thermoelectric performance of polycrystalline p-type SnSe, Applied Physics Letters 104, May 30, 2014, pp. 212105-1-212105-4.

(Continued)

*Primary Examiner* — Binh Tat
(74) *Attorney, Agent, or Firm* — Bell & Manning, LLC

(57) ABSTRACT

Thermoelectric materials and thermoelectric cells and devices incorporating the thermoelectric materials are provided. Also provided are methods of using the cells and devices to generate electricity and to power external electronic devices. The thermoelectric materials comprise SnSe single crystals, including hole doped SnSe single crystals.

20 Claims, 15 Drawing Sheets

(56) References Cited

OTHER PUBLICATIONS

Yu et al., Growth and Electronic Properties of the SnSe Semiconductor, Journal of Crystal Growth 54, 1981, pp. 248-252.
Zhao et al., Ultralow thermal conductivity and high thermoelectric figure of merit in SnSe crystals, Nature, vol. 508, Apr. 16, 2014, pp. 373-377.
International Search Report and Written Opinion mailed in PCT Application No. PCT/US2015/044704, dated Nov. 26, 2015.
Ding et al., High-efficient thermoelectric materials: The case of orthorhombic IV-VI compounds, Scientific Reports, 5: 9567, Mar. 27, 2015, pp. 1-8.
Wasscher et al., Simple Evaluation of the Maximum Thermoelectric Figure of Merit, With Application to Mixed Crystals SnSl—xSex, Solid-State Electronics Pergamon Press, vol. 6, 1963, pp. 261-264.
Zhao et al., Ultrahigh power factor and thermoelectric performance in hole-doped single-crystal SnSe, Sciencexpress Reports, Nov. 26, 2015.

\* cited by examiner

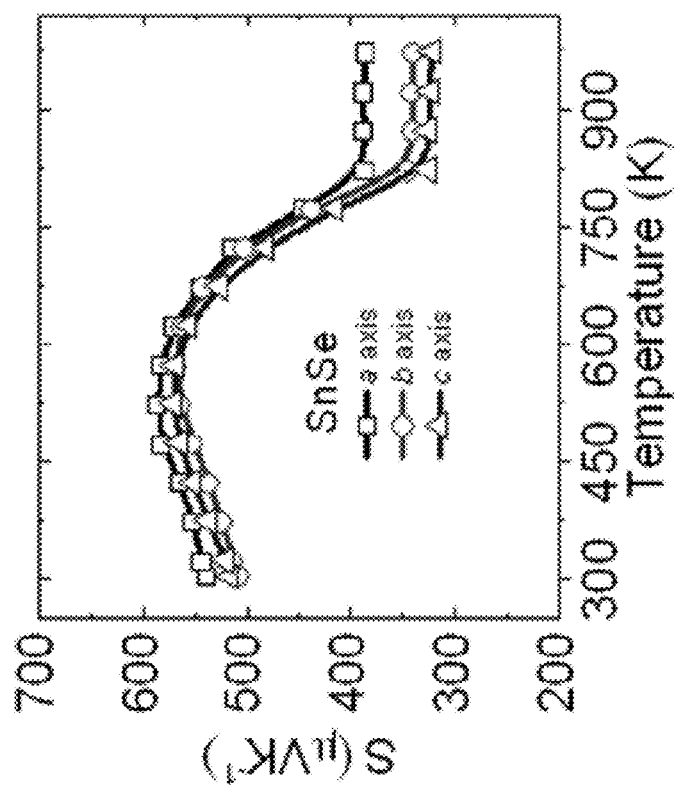
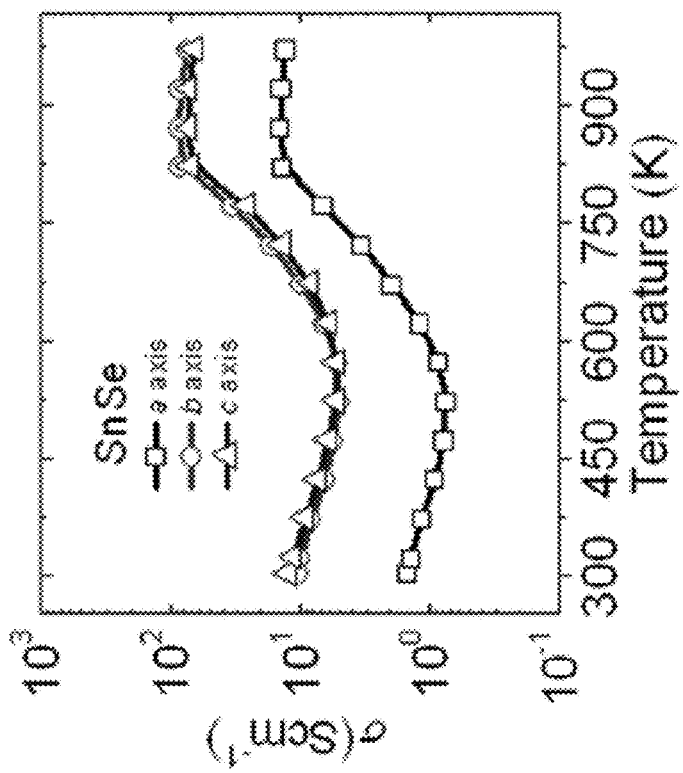
FIG. 2A
FIG. 2B

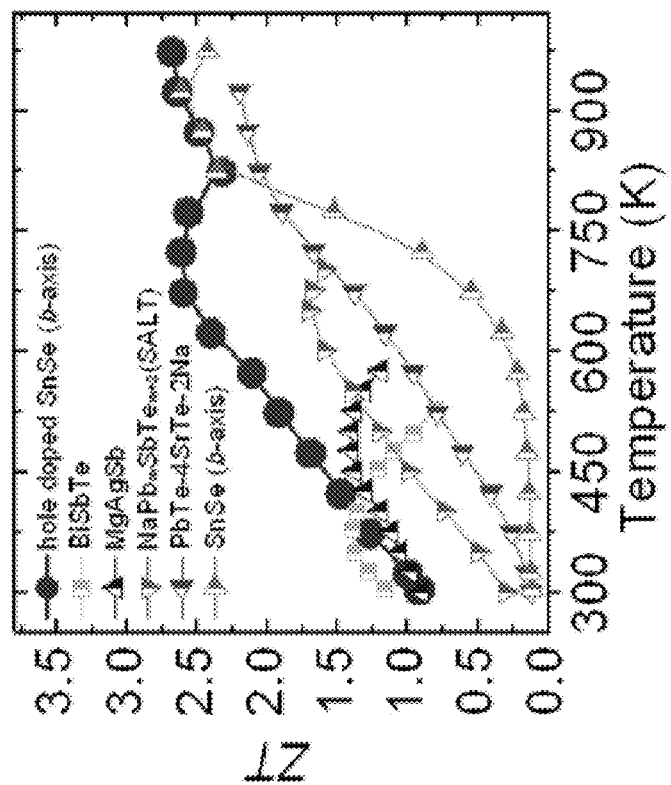
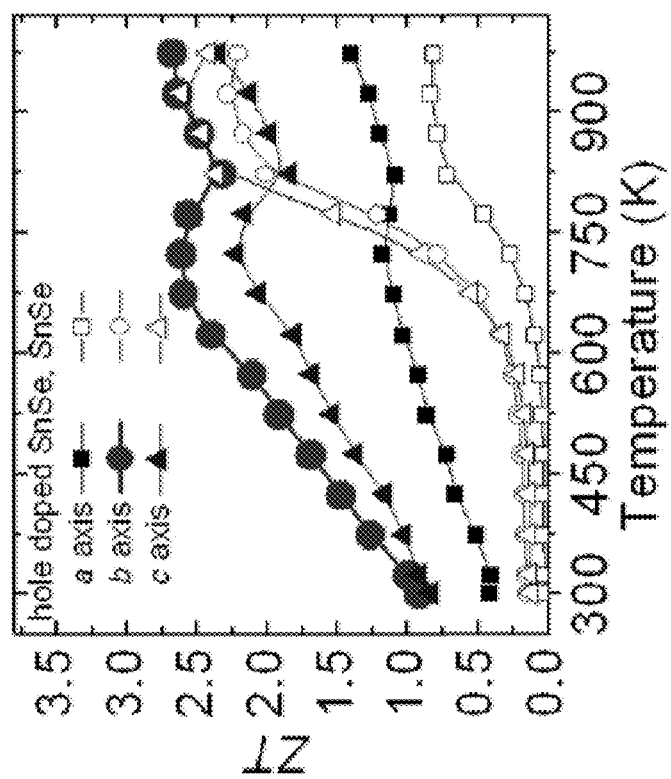
FIG. 5A
FIG. 5B

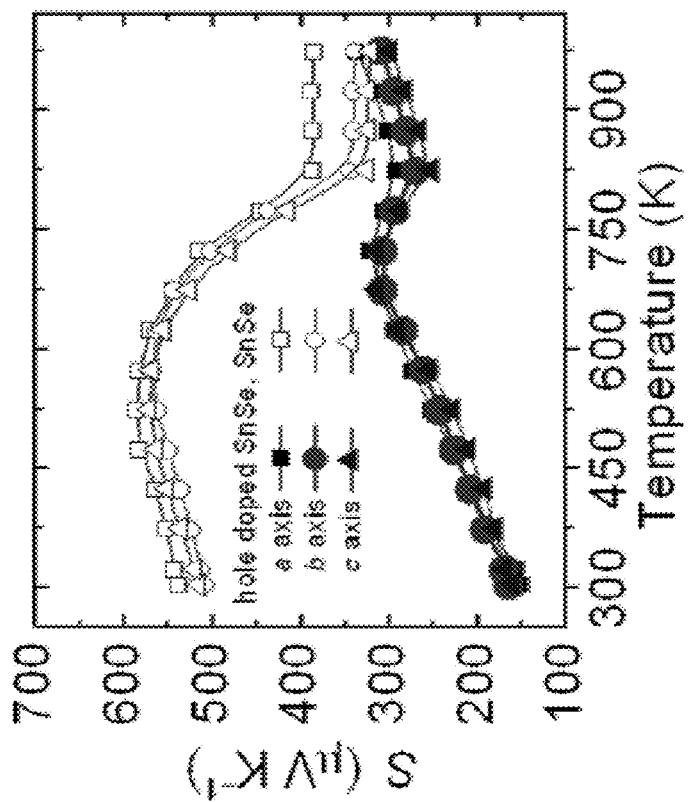
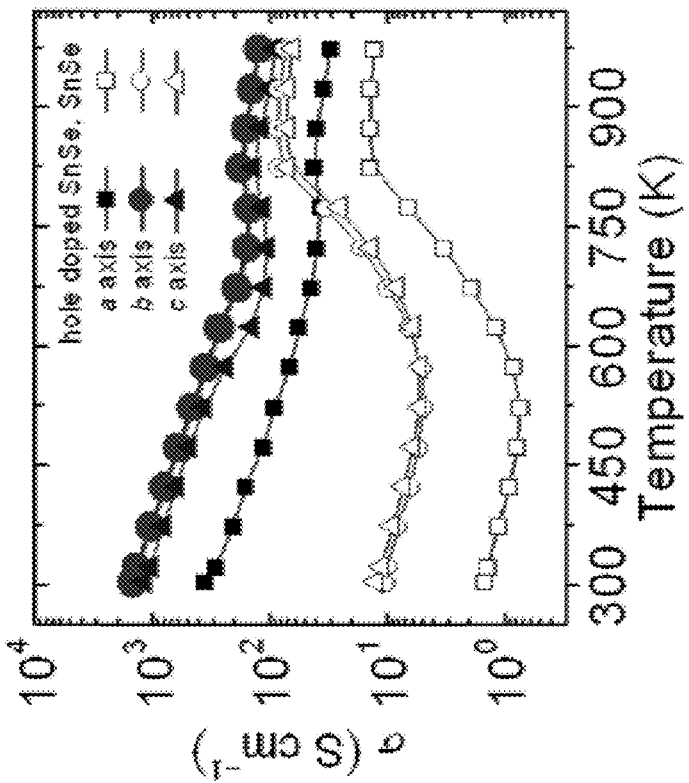
FIG. 6B
FIG. 6A

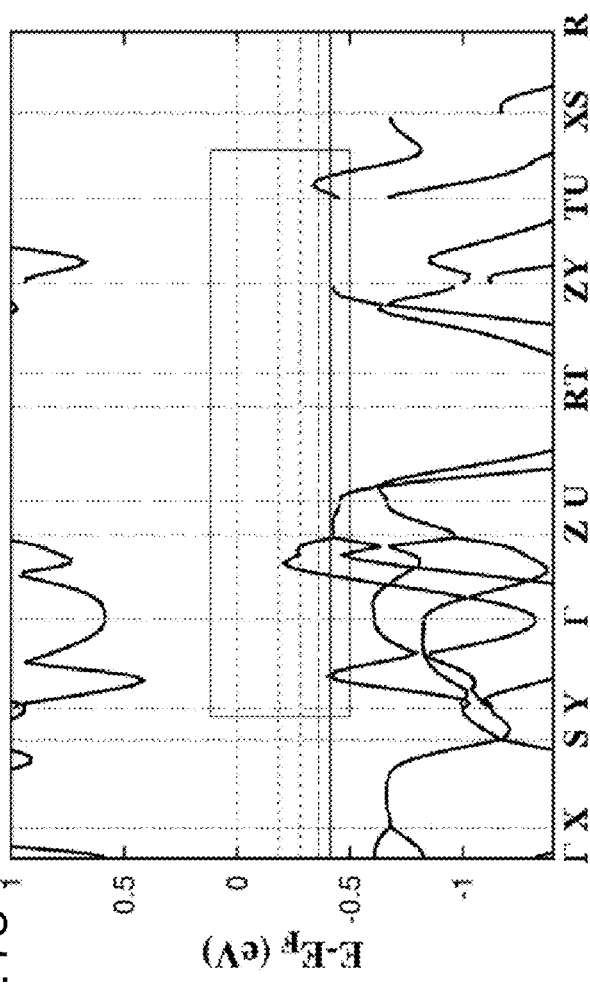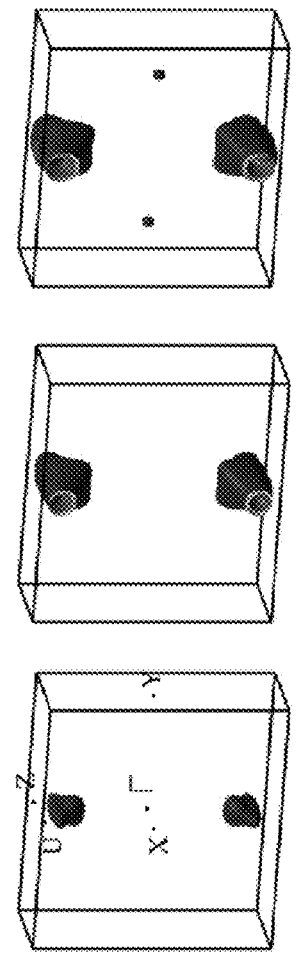
FIG. 7C
FIG. 7D  FIG. 7E  FIG. 7F

TIN SELENIDE SINGLE CRYSTALS FOR THERMOELECTRIC APPLICATIONS

CROSS-REFERENCE TO RELATED APPLICATIONS

The present application claims priority to U.S. Provisional Patent Application No. 62/036,736 that was filed Aug. 13, 2014, the entire contents of which are hereby incorporated by reference.

REFERENCE TO GOVERNMENT RIGHTS

This invention was made with government support under grant number DE-SC0001054 (subcontract 61-3212A Michigan State University to Northwestern University) awarded by the Department of Energy. The government has certain rights in the invention.

BACKGROUND

The efficiency of thermoelectric materials and devices is determined by the dimensionless figure of merit (ZT), defined as $ZT=(S^2\sigma/\kappa)T$, where S, $\sigma$, $\kappa$, and T are the Seebeck coefficient, the electrical conductivity, the thermal conductivity, and the absolute temperature, respectively[1]. The numerator product ($S^2\sigma$) is called the power factor (PF). The well known interdependence of S, $\sigma$ and $\kappa$, complicates efforts in developing strategies for improving a material's average ZT well above 2.5, especially using less expensive, more earth-abundant materials,[2, 3, 4] a feat that could revolutionize the field of thermal energy conversion. Several approaches to enhance ZT have emerged in the last decade including; modifying the band structure[5], heavy valence (conduction) band convergence[6, 7], quantum confinement effects[8] and electron energy barrier filtering[9] to enhance Seebeck coefficients; nanostructuring[10], all-scale hierarchical architecturing[11], and band energy alignment between nano-precipitate/matrix to maintain hole mobility[12, 13, 14]. Most of these approaches aim to maintain a high power factor and reduce the lattice thermal conductivity. Alternatively, one can seek high performance in pristine thermoelectric materials with intrinsically low thermal conductivity, which may arise from a large molecular weight[15], a complex crystal structure[16] and charge density wave (CDWs) distortions[17].

Recent years have witnessed the steady upward march of the thermoelectric figure of merit ZT. Enhancing ZT across a wide range of temperatures means enhancing the conversion efficiency of heat to electricity for a large number of potential applications. However, many of the advances have focused on improvements in the maximum ZT ($ZT_{max}$) as a function of temperature, and they have been achieved from the emergence of new concepts which enabled the huge reduction in lattice thermal conductivity (e.g., nano structuring).

SUMMARY

Thermoelectric materials and thermoelectric cells and devices incorporating the materials are provided. Also provided are methods of using the cells and devices to generate electricity and to power external electronic devices.

The thermoelectric materials are characterized by a length and comprise SnSe single crystals having an a-axis, a b-axis and a c-axis. Within the thermoelectric materials, not all crystalline orientations of the SnSe single crystals are represented equally along the length of the material, such that SnSe single crystals oriented along their b-axial direction or their c-axial direction, as defined with respect to the room temperature crystal structure of the SnSe, are selectively favored relative to those oriented along their a-axial direction. In some embodiments, the thermoelectric materials have a $ZT_{max}$ value of at least about 1.3 at a temperature of greater than 800 K, as measured along the length of the thermoelectric material.

One embodiment of a thermoelectric cell comprises: a thermoelectric material having a length defined between a first end and a second end; a first contact comprising a thermally and electrically conductive material at the first end of the thermoelectric material; and a second contact comprising a thermally and electrically conductive material at the second end of the thermoelectric material. The thermoelectric material comprises SnSe single crystals having an a-axis, a b-axis and a c-axis, wherein not all crystalline orientations of the SnSe single crystals are represented equally along the length of the material, such that SnSe single crystals oriented along their b-axial direction or their c-axial direction, as defined with respect to the room temperature crystal structure of the SnSe, are selectively favored relative to those oriented along their a-axial direction. In some embodiments, the thermoelectric materials have a $ZT_{max}$ value of at least about 1.3 at a temperature of greater than 800 K, as measured along the length of the thermoelectric material.

One embodiment of a method of powering an external device using a thermoelectric cell uses a thermoelectric cell comprising: a thermoelectric material comprising SnSe single crystals and having a first end and a second end; a first contact comprising a thermally and electrically conductive material at the first end; and a second contact comprising a thermally and electrically conductive material at the second end. In some embodiments, the thermoelectric material has a $ZT_{max}$ value of at least about 1.3 at a temperature of greater than 800 K, as measured between the first end and the second end. The method comprises connecting an external electrical device to the thermoelectric cell; and exposing the thermoelectric material to a temperature gradient between its first end and its second end that results in the generation of electricity in the thermoelectric material, wherein the external electrical device is powered by the electricity.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described.

FIG. 2A. Electrical conductivity as a function of temperature for SnSe crystals. FIG. 2B. Seebeck coefficient as a function of temperature for SnSe crystals.

FIG. 5A. ZT values along different axial directions with a comparison of hole doped SnSe and undoped SnSe crystals[1]; the ZT measurement uncertainty is about 15%. FIG. 5B. ZT values comparison of hole doped SnSe (b axis) and the current state-of-the-art p-type thermoelectrics, BiSbTe[22], MgAgSb[14], NaPb$_m$SbTe$_{m+2}$ (SALT)[10], PbTe-4SrTe-2Na[15] and SnSe (b axis)[1].

FIG. 6A. Electrical conductivity as a function of temperature for hole doped SnSe crystals. FIG. 6B. Seebeck coefficient as a function of temperature for hole doped SnSe crystals.

FIG. 7C. Electronic band structure of hole doped SnSe indicating a non-parabolic multi-band. The dotted lines from up to bottom represent the Fermi levels with carrier densities of 5×10$^{17}$ cm$^{-3}$, 5×10$^{19}$ cm$^{-3}$, 2×10$^{20}$ cm$^{-3}$, and 5×10$^{20}$ cm$^{-3}$, respectively, indicating that the heavy doping pushes the Fermi level deep into the second valence band in the band structure. FIG. 7D. The Fermi surface of SnSe (Pnma) at 5×10$^{19}$ cm$^{-3}$. FIG. 7E. The Fermi surface of SnSe (Pnma) at 2×10$^{20}$ cm$^{-3}$. FIG. 7F. The Fermi surface of SnSe (Pnma) at 5×10$^{20}$ cm$^{-3}$.

DETAILED DESCRIPTION

Figures 1A, 1B, 1C, 1D:
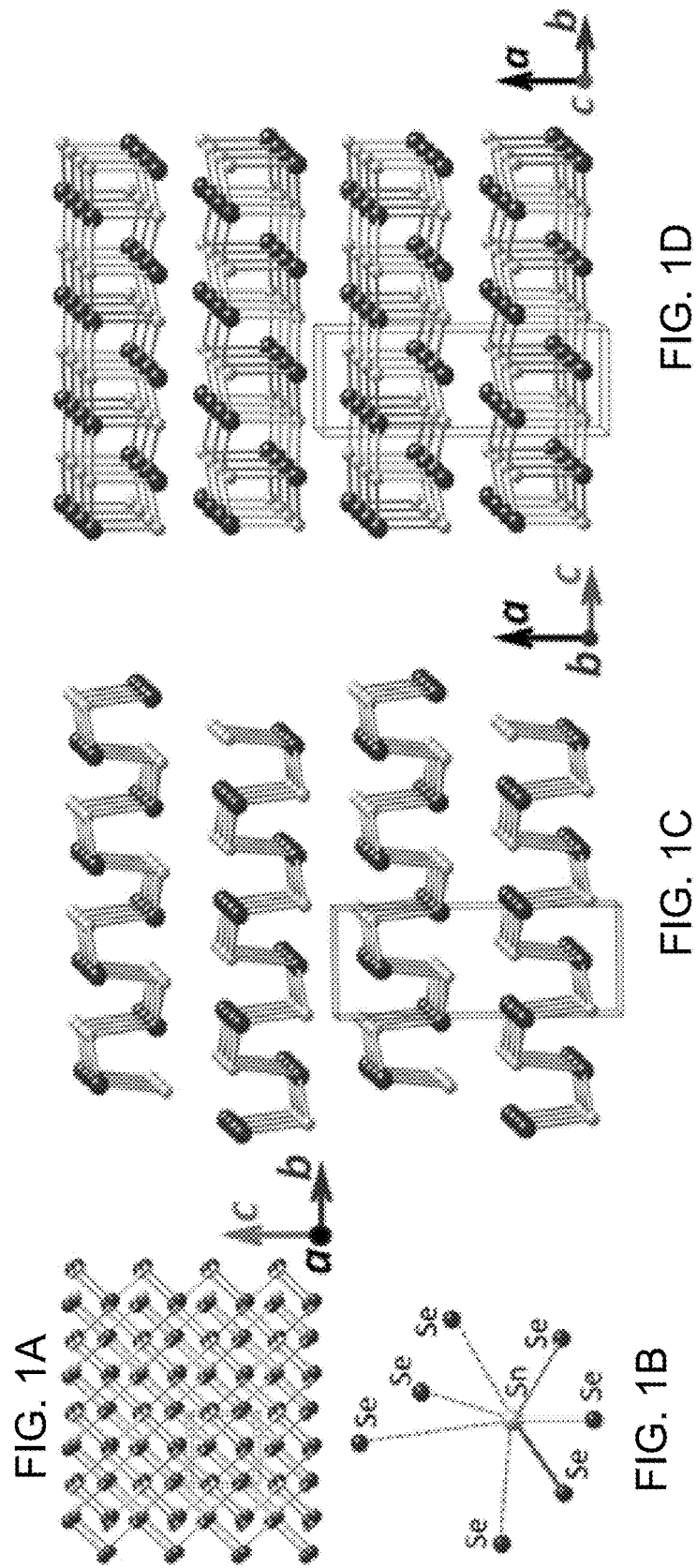
FIG. 1A. Crystal structure of SnSe along its a axis, Sn atoms (light), Se atoms (dark).
FIG. 1B. Highly distorted SnSe$_7$ coordination polyhedron with three short and four long Sn—Se bonds.
FIG. 1C. Structure of SnSe along its b axis.
FIG. 1D. Structure of SnSe along its c axis.

Thermoelectric materials are provided. Also provided are thermoelectric cells and thermoelectric devices, including electricity generators, comprising the thermoelectric materials. Method of using the cells and devices to generate electricity and power external electronic devices are also provided.

The thermoelectric materials comprise, consist of or consist essentially of SnSe single crystals. As such, the materials can be distinguished from mixed crystals of SnSe with other chalcogenides or solid solutions of SnSe with other chalcogenides, such as SnS.

The SnSe is a simple binary compound that adopts a layered orthorhombic crystal structure at room temperature, which can be derived from a three dimensional distortion of the NaCl structure. Perspective views of the room temperature SnSe crystal structure along the a, b and c axial directions are shown in FIGS. 1A, 1B, 1C and 1D. There are two-atom-thick SnSe slabs (along the b-c plane) with strong Sn—Se bonding within the plane of the slabs, which are then linked with weaker Sn—Se bonding along the a-direction[20]. The structure contains highly distorted SnSe$_7$ coordination polyhedron with three short and four very long Sn—Se bonds and a lone pair of the Sn$^{2+}$ atoms sterically accommodated in between the four long Sn—Se bonds, see FIG. 1B. The two-atom-thick SnSe slabs are corrugated creating a zig-zag accordion-like projection along the b-axis.

As described in the examples below, at least some embodiments of the present inventions can be attributed to the discovery that the thermal conductivity of the SnSe is intrinsically ultralow, making it possible to achieve very high ZT values, when measured along the b- or c-axial directions, at temperatures above 800° C. Therefore, it is desirable that the SnSe crystals in the material are highly oriented along their b-axial direction or their c-axial direction, as defined with respect to the room temperature crystal structure of the SnSe. This can be accomplished, for example, by texturing a SnSe powder sample. As a result of the texturing, not all crystalline orientations will be equally represented in the textured sample. Instead, certain orientation can be selectively favored to provide a material comprising highly crystallographically oriented crystals. Using a technique such as powder texturing, the SnSe crystals in a material can be highly oriented in the bc-crystallographic plane. A SnSe sample may be considered highly oriented if a substantial majority (for example >80%, and more desirably >90%) of the crystals in the sample are substantially oriented (for example, within ±10°, and more desirably ±5°) in a given crystallographic plane, where the terms 'substantial' and 'substantially' are used to indicate that not every crystal needs to be aligned and that the alignment does not have to be perfect for every crystal. Descriptions of techniques for texturing crystal samples can be found, for example, in Noudem et al., Physica C: Superconductivity 230 (1-2), 42-50 (1994); Masuda et al., J. Mat. Chem. 13 (5), 1094-1099 (2003); and Castro et al., J. Mat. Chem 9 (6), 1313-1317 (1999).

The thermoelectric materials are characterized by the ability to provide high $ZT_{max}$ values at temperatures above a phase transition temperature, as discussed in detail in Example 1. In some embodiments, such as embodiments in which the thermoelectric material is a textured SnSe powder, the materials have a $ZT_{max}$ value of at least about 1.3 at a temperature greater than 800 K, as measured along the direction of alignment (for example, along the b-axis and/or the c-axis along the length of the material). In some embodiments, the materials have a $ZT_{max}$ value of at least about 2 at a temperature greater than 800 K, as measured along the direction of alignment.

The thermoelectric properties of the materials can be further enhanced by p-type doping (i.e., hole doping) the SnSe crystals to increase their electrical conductivity and favorably alter their energy band structure, as illustrated in Example 2. Externally doping the SnSe to an appropriate carrier concentration results in a dramatic increase in the power factor, which is derived from an increased Seebeck coefficient. As a result, the doped SnSe single crystals are able to provide very high $ZT_{ave}$ values over the temperature range from about 300 K to about 923 K, as well as very high $ZT_{max}$ values at temperatures of 600 K or greater—and particularly at temperatures of 800 K or greater. By way of illustration only, some embodiments of the thermoelectric materials comprising p-type doped SnSe have a $ZT_{max}$ value of at least 1.5 at a temperature of 600 K, as measured along the direction of alignment (for example, along the b-axis and/or the c-axis along the length of the material). This includes embodiments of the thermoelectric materials having a $ZT_{max}$ value of at least 1.8 at a temperature of 600 K, as measured along the direction of alignment; further includes thermoelectric materials having a $ZT_{max}$ value of at least 2 at a temperature of 600 K, as measured along the direction of alignment; still further includes thermoelectric materials having a $ZT_{max}$ value of at least 2 at a temperature of 973 K, as measured along the direction of alignment; and yet further includes thermoelectric materials having a $ZT_{max}$ value of at least 2.5 at a temperature of 973 K, as measured along the direction of alignment.

The thermoelectric materials comprising, consisting of, or consisting essentially of doped SnSe single crystals may also provide high $ZT_{ave}$ values even over temperature ranges starting at room temperature. For example, some embodiments of the thermoelectric materials comprising p-type doped SnSe have a $ZT_{ave}$ value of at least 1.5 over the temperature range from 300 K to 923 K, as measured along the direction of alignment (for example, along the b-axis and/or the c-axis along the length of the material). This includes embodiments of the thermoelectric materials that have a $ZT_{ave}$ value of at least 2 over the temperature range from 300 K to 923 K, as measured along the direction of alignment.

Sodium is an example of an element that can be used for hole doping of the SnSe single crystals. However, other dopants, such as lithium, may also be used. The dopant concentration may be sufficiently high to provide a hole density of, for example, at least $1 \times 10^{19}$ cm$^{-3}$. In some embodiments of the doped materials, including materials in which sodium is used as the dopant, the dopant concentration may be in the range from about $1 \times 10^{19}$ cm$^{-3}$ to about $1 \times 10^{20}$ cm$^{-3}$. However, higher carrier concentrations can also be employed.

The thermoelectric materials can be used in thermoelectric cells. A thermoelectric cell comprises the thermoelectric material having a first end and a second end. Along the length of the material between the first and second ends, the SnSe single are oriented along their b-axial direction or their c-axial direction, as defined with respect to the room temperature crystal structure of the SnSe. A first contact is disposed at the first end of the thermoelectric material and a second contact is disposed at the second end of the thermoelectric material. The contacts may be comprised of one or more thermally and electrically conductive materials. A plurality of the thermoelectric cells can be connected in series or in parallel to form a thermoelectric device. The thermoelectric cells and devices may be, for example, thermoelectric electricity generators, thermoelectric coolers or thermoelectric heat sensors.

In a thermoelectric electricity generator, heat is converted into electrical power through the Seebeck effect. When a temperature gradient is applied across a length of the thermoelectric material, there is a net flow of electrons from the first end of the material to the second end that results in voltage generation. An electrical load, such as an external electric device, can be connected between the first and second contacts, and the electrical power output from the thermoelectric material can be used to power the external device. This mechanism allows useful conversion of thermal energy, such as waste heat, into electrical energy. The mechanism can also be run in reverse for cooling, using the Peltier effect.

Example 1

This example demonstrates the finding that SnSe, which is a very stable and simple compound composed of earth-abundant elements, exhibits an intrinsically ultralow thermal conductivity. Historically, SnSe was ignored in the thermoelectric community[18], however, its layered and anisotropic crystal structure motivated us to explore its electrical transport properties along all axial directions (unless otherwise noted, all crystallographic directions and planes in this disclosure are defined with respect to its room temperature form, Pnma space group, #62). Surprisingly, we found that the electrical resistivity was low enough to result in a moderate power factor (along the b axis), but even more surprisingly, we observed that the thermal conductivity of SnSe was intrinsically ultralow (<0.25 Wm$^{-1}$K$^{-1}$ at >800K), resulting in an unprecedented ZT=2.62 at 923K along the b-axis and 2.3 along the c-axis. Along the a direction, however, the ZT is significantly lower, ~0.8. Here, it should be noted that SnSe along its b axis shows ZT=0.12 at room temperature, which is consistent with the value of 0.15 at room temperature reported by Wasscher et. al.[19], but SnSe reveals high ZT values near and above the transition temperature of 750K. Such ultrahigh ZT along two principal directions and the observed crystallographic and ZT anisotropy prompted us to investigate the scientific underpinning of these intriguing results.

All our results and measurements are defined with respect to the room temperature crystal form and unit cell for SnSe (FIGS. 1A-D).

Figure 1E:
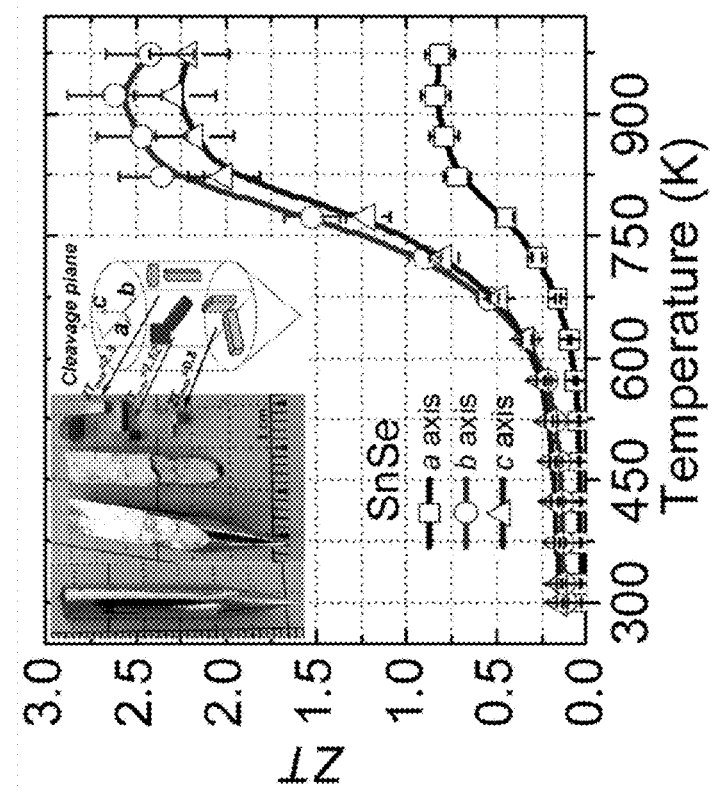
FIG. 1E. ZT values for SnSe along different axial directions; the measurement uncertainty is about 15% (error bars). The inset shows a typical crystal, a crystal cleaved along (100) plane, specimens cut along the three axes and corresponding measurement directions, and a diagram of how crystals were cut for directional measurements.

The ZT values along the three different crystallographic axes are shown in FIG. 1E. The inset of FIG. 1E shows the SnSe crystals and the cutting directions for typical samples in this study. It should be noted that the a, b and c axial directions were determined through x-ray diffraction (XRD) as well as electron backscatter diffraction analysis (EBSD) observations.

The electrical conductivities for SnSe crystals along different crystallographic directions showed the same temperature dependent trend (FIG. 2A). We observed three regions, first metallic transport behavior from 300-525K, then a change to thermally activated semiconducting behavior up to ~800K, and above that a nearly temperature independent trend up to 973K. The first upturn above 525K is attributed to the thermal excitation of carriers, while the second is related with the phase transition from the Pnma (a=11.49 Å, b=4.44 Å, c=4.135 Å) to the Cmcm (a=4.31 Å, b=11.70 Å, c=4.31 Å) space group[21, 22]. It can be readily seen that the electrical conductivity along the b and c directions is similar, while it is lower along the a direction. This anisotropy is due to the higher ratio of Hall coefficient to resistivity $R_H/\rho$ (related to mobility) within the plane of the SnSe slabs, as opposed to perpendicular to them (i.e., along a direction). The Seebeck coefficients showed almost isotropic behavior and were independent of crystallographic direction, FIG. 2B. The gradual decrease of the Seebeck coefficients above 525K is consistent with the increasing trend in the electrical conductivity and suggests bipolar conduction and an increasing inverse Hall coefficient $R_H$. This behavior is consistent with our electronic band structure calculations, which showed that the band gap ($E_g$) decreases considerably from Pnma (0.61 eV) to Cmcm (0.39 eV) and thus the bipolar conduction process is expected with rising temperature.

The power factor along the b axis shows the highest value of 10.1 $\mu Wcm^{-1}K^{-2}$ around 850 K compared to the other two axial directions (FIG. 2C); the maximum power factors at 850 K along the c and a directions are 7.9 $\mu Wcm^{-1}K^{-2}$ and 2.1 $\mu Wcm^{-1}K^{-2}$, respectively. Compared to other state-of-the-art thermoelectrics[2, 3, 4], the power factors obtained in SnSe crystals are moderate, but are much higher than those found in other thermoelectrics with intrinsically low overall thermal conductivity (e.g. $Yb_{14}MnSb_{11}$, $Ag_6TlTe_5$, AgSbTe$_2$)[15, 16, 23]. The highest power factor along b is in agreement with the highest $R_H/\rho$ of 250 $cm^2V^{-1}s^{-1}$ obtained along this axis, which is two-fold higher than that along the c axis, and ten-fold higher than that along the a axis.

Figure 2D:
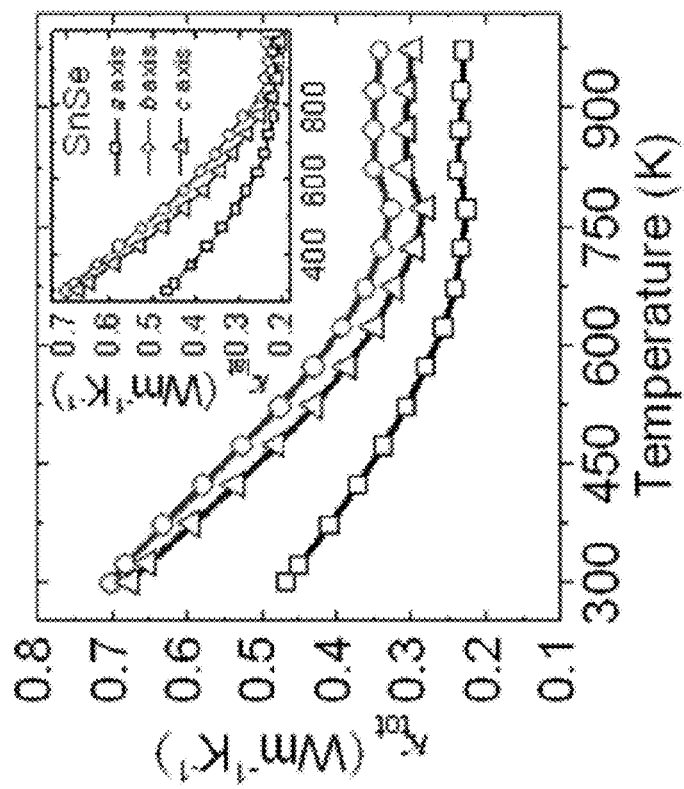
FIG. 2D. Total thermal conductivity, as a function of temperature for SnSe crystals; the inset shows the lattice thermal conductivity.
Figure 2C:
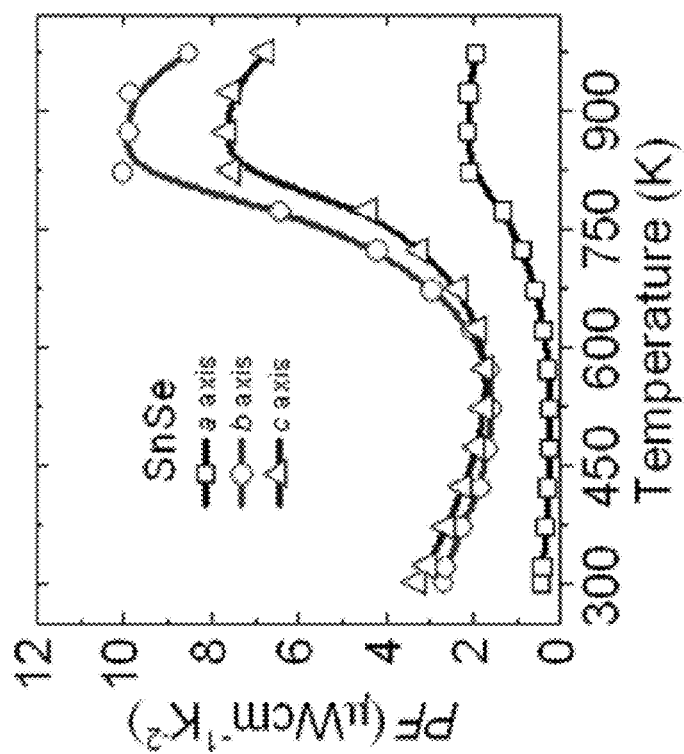
FIG. 2C. Power factor as a function of temperature for SnSe crystals.

The temperature dependence of total thermal conductivity ($\kappa_{tot}$) is shown in FIG. 2D. At room temperature, the $\kappa_{tot}$ are ~0.46 $Wm^{-1}K^{-1}$, 0.70 $Wm^{-1}K^{-1}$, and 0.68 $Wm^{-1}K^{-1}$ along the a, b, and c axis directions, respectively. Compared to state-of-the-art thermoelectrics[2, 3, 4], these thermal conductivity values are exceedingly low. Surprisingly, these low values continue to decrease with rising temperature and fall further down to the range of 0.22 $Wm^{-1}K^{-1}$ to 0.34 $Wm^{-1}K^{-1}$ at 973K. The ratio of lattice thermal conductivity ($\kappa_{lat}$) to $\kappa_{tot}$ indicates that $K_{tot}$ is dominated by phonon transport. The inset in FIG. 2D indicates that $K_{lat}$ falls as low as 0.20 $Wm^{-1}K^{-1}$ at 973K along the a direction. This is a remarkably low value which is lower than those obtained even by nanostructuring and all-scale hierarchical architecturing of PbTe-based thermoelectric materials[11].

Figure 3A:
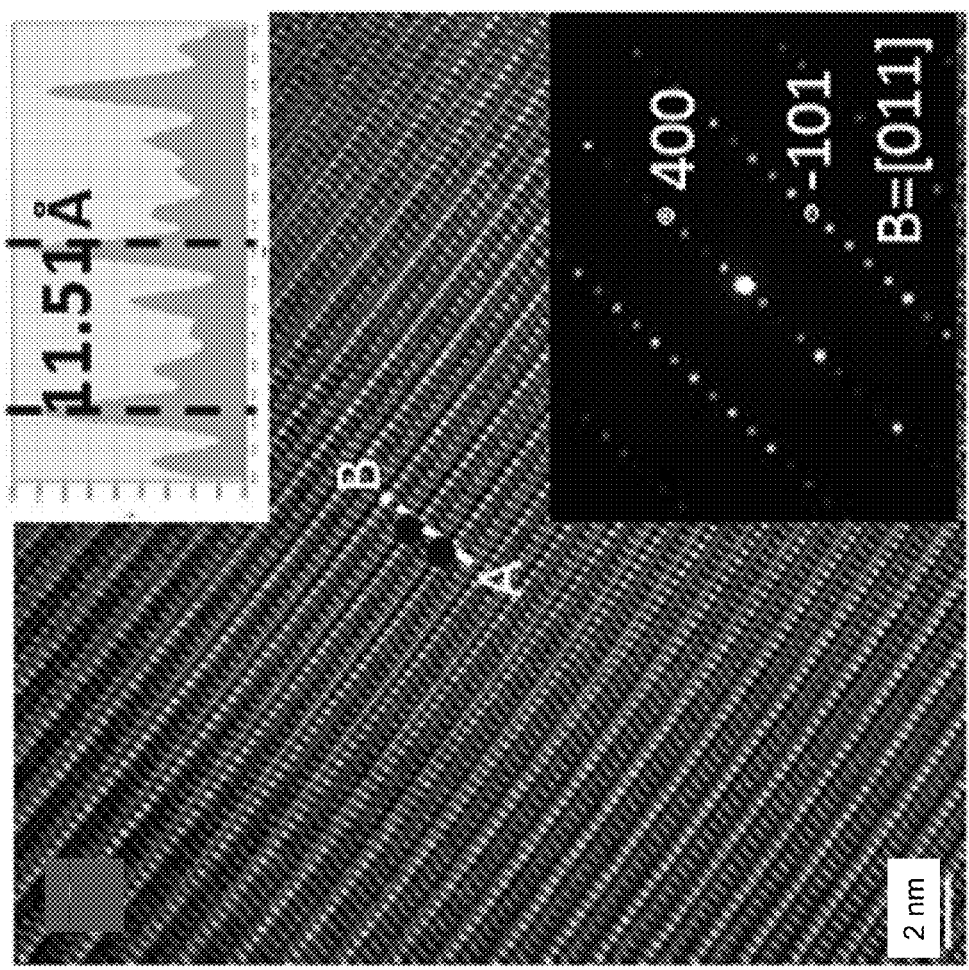
FIG. 3A. High resolution TEM image of single crystalline SnSe. Insets are the corresponding diffraction pattern along the [011] zone axis, and the line profile along dotted line AB showing the d-spacing of (100), respectively.

The dynamic structural behavior of SnSe involving a reversible phase transition from the low temperature Pnma space group to the Cmcm space group above 750 K helps to preserve the high power factor[22]. This is because the Cmcm phase, which is closely related to the Pnma phase, exhibits substantially reduced energy gap and enhanced carrier mobilities while maintaining the ultralow thermal conductivity. We have confirmed this transition using in-situ heating in TEM. A defect-free lattice image of a SnSe specimen is shown in FIG. 3A with the corresponding selected area diffraction (SAD) pattern taken along the [011] zone axis as the inset. It should be noted that kinematically forbidden reflections for the Cmcm space group, of the type {100}, occur due to ubiquitous double diffraction in electron diffraction along these directions, and reflect the presence of translational symmetry elements (screw axes/glide planes) in the space group[24]. Other detailed crystal information, including high resolution TEM images along multiple crystal orientations ([100], [201], [211], [021]) and SAD along [001] and [010], confirmed the single crystalline SnSe phase at room temperature.

Figure 3B:
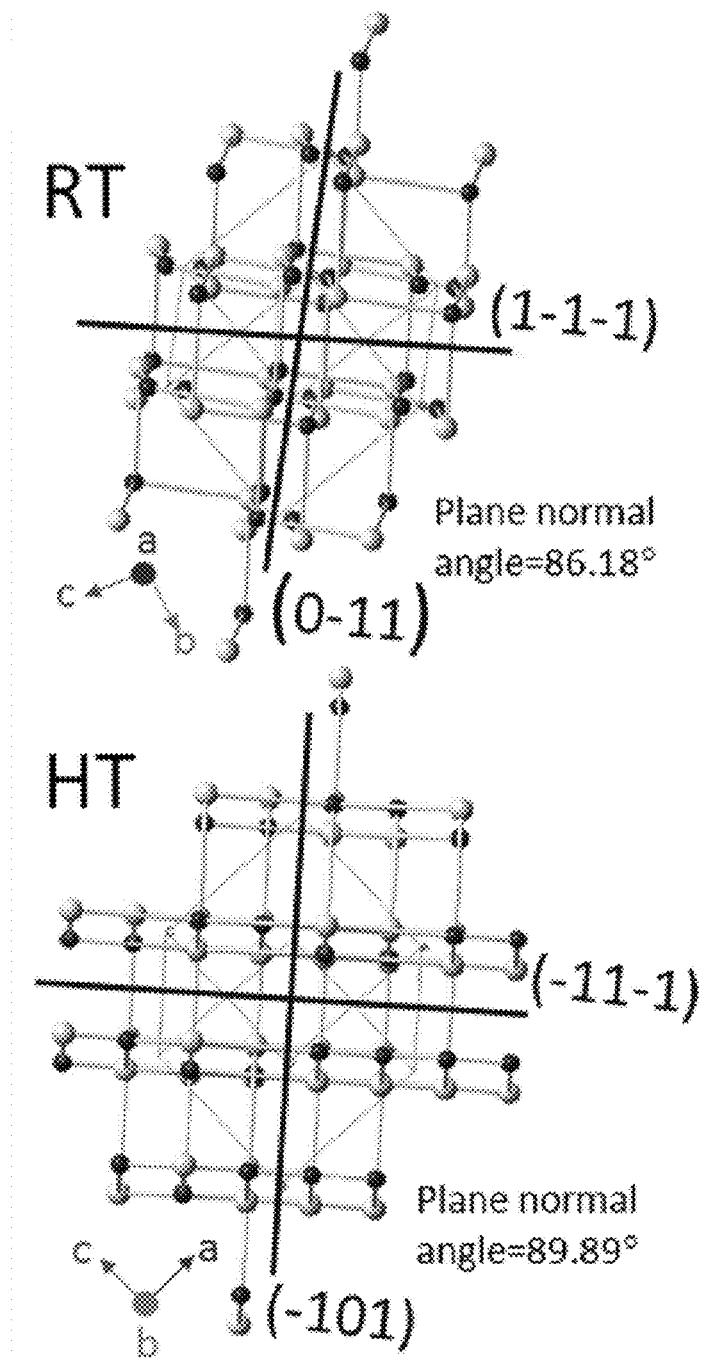
FIG. 3B. The simulated crystal structures of SnSe phases at room temperature (Pnma) and high temperature (Cmcm). Viewing along the [211] and [121] directions. Lines are marked for the planes (1-1-1) and (0-11).
Figure 3C:
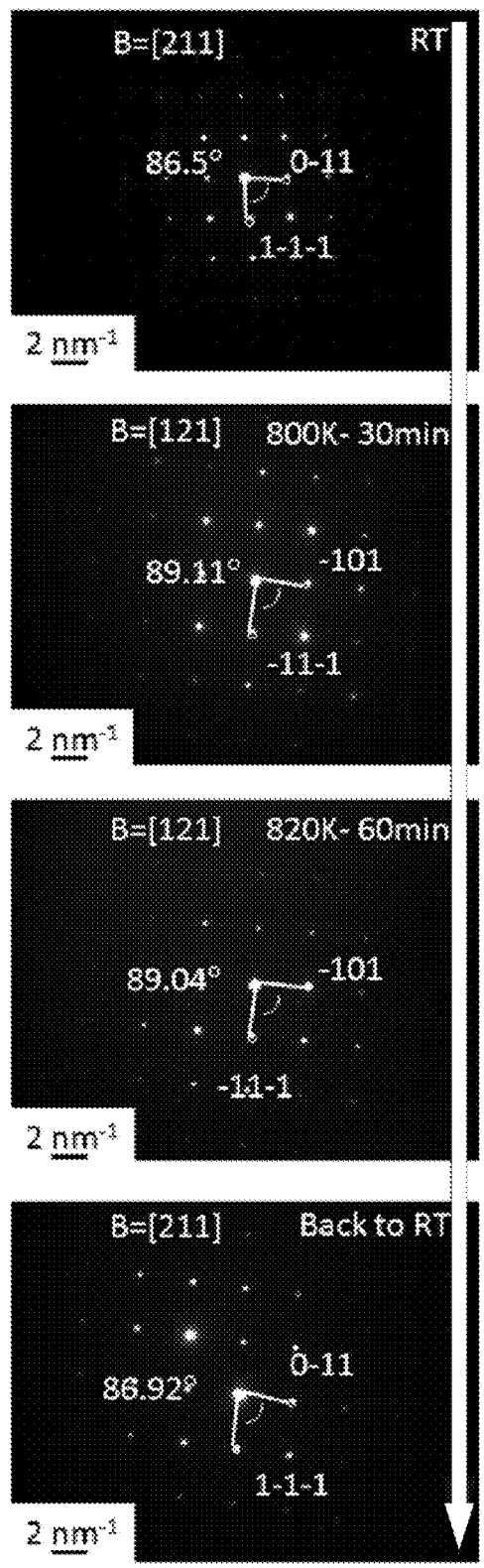
FIG. 3C. Diffraction patterns for SnSe obtained at different temperatures. There is about a 2.6° difference in the measured angles between room and elevated temperatures.

We conducted in-situ thermal TEM measurements to verify the phase transition. The selected area diffraction (SAD) mode (obtained after zone axis aligning with convergent beam electron diffraction—CBED) was chosen because it is sensitive and deterministic to subtle changes in the crystal symmetry, especially angular rotations. The [211] zone axis at room temperature, which becomes the [121] zone after the transition at about 750-800 K, was chosen to resolve the evolution of the planes (1-1-1) and (0-11). As illustrated by the crystal models in FIG. 3B, viewing along [211] and [121] at room and high temperature, respectively, the plane normal angle between (1-1-1) and (0-11) (marked as blue lines) is expected to change from 86.18° to 89.89° upon phase transition. FIG. 3C reflects this variation of the angle on the SADs experimentally. The diffraction patterns in FIG. 3C were obtained from the same sample area. The temperature was ramped rapidly to 800K and 820K, and then the sample was held steady for 30 and 60 min, respectively. The angle between (1-1-1) and (0-11) increased by 2.7° when 800K was reached. The high temperature phase is stable up to 820K for an extended duration. There was no noticeable change in terms of d-spacing and angles between the two SADs at elevated temperatures. In addition, the phase transition was observed to be reversible by ramping back to room temperature and monitoring the SAD of the Pnma phase which reappears. These observations are consistent with a displacive reversible phase transition between the Pnma and Cmcm space groups at about 800K. Given the subtle angular changes in diffraction observations, it is likely that the phase transition may involve mere shuffling, as expected for a displacive second order phase transition, and it is consistent with the very close relationship of the two structures.

Figure 4A:
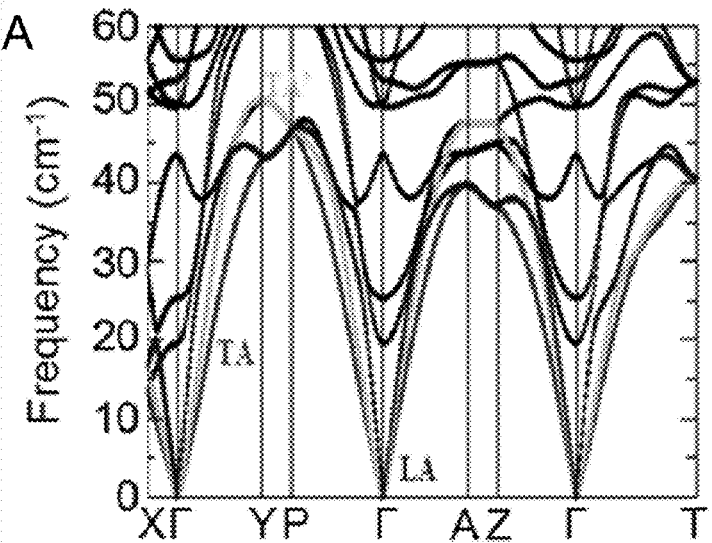
FIG. 4A. Theoretically calculated phonon dispersion for SnSe crystals.
Figure 4B:
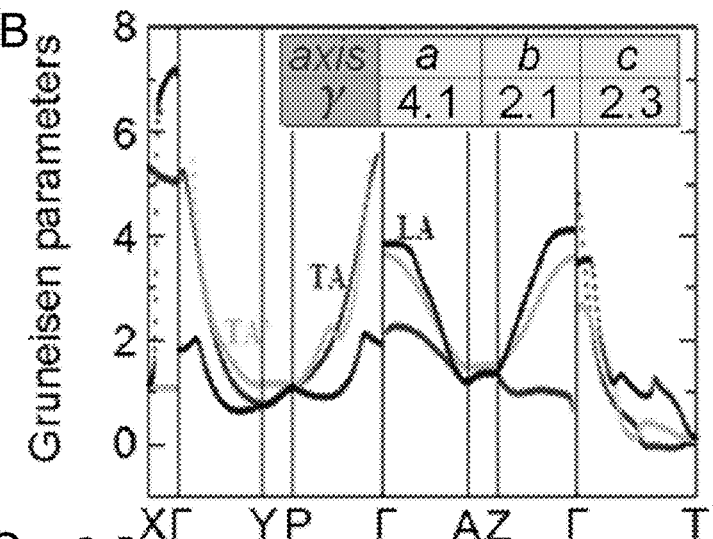
FIG. 4B. Theoretically calculated Grüneisen dispersion; the inset shows the average Grüneisen parameters along the a, b and c axes.

It is known that strong anharmonicity in bonding can give rise to low lattice thermal conductivity in ordered crystal structures.[23, 25, 26] The strength of the lattice anharmonicity can be estimated by the Grüneisen parameters, which characterize the relationship between phonon frequency and crystal volume change. Therefore, to clarify the origin of the intrinsically low thermal conductivity of SnSe, the phonon and Grüneisen dispersions were calculated using first-principles density-functional theory (DFT) phonon calculations within the quasi-harmonic approximation. FIG. 4A shows that the acoustic modes along the ΓX Brillouin zone direction (a axis) are significantly softer (lower Debye temperatures and smaller phonon velocities) than those along both ΓY (b axis) and ΓZ Brillouin zone directions (c axis). These soft modes along the a axis suggest weak interatomic bonding and possible strong anharmonicity. To quantitatively assess the anharmonicity along the three directions, we plot the dispersion of the Grüneisen parameters of SnSe (FIG. 4B), which show that the Grüneisen parameters are all very large, with that along the a axis being larger than those along both b and c axes. The average Grüneisen parameters along the a, b, and c axes are 4.1, 2.1 and 2.3, respectively, as shown in the inset of FIG. 4B. Along the a axis, the maximum longitudinal acoustic (LA) Grüneisen parameter around the Γ point is extraordinarily high, ~7.2. In contrast, the Grüneisen parameter is 2.05 for $AgSbTe_2$[23], 3.5 for $AgSbSe_2$[25], and 1.45 for PbTe[27], respectively, corresponding to measured lattice thermal conductivity at room temperature of 0.68 $Wm^{-1}K^{-1}$, 0.48 $Wm^{-1}K^{-1}$ and 2.4 $Wm^{-1}K^{-1}$, respectively. The anomalously high Grüneisen parameter of SnSe is a reflection of its crystal structure which contains very distorted $SnSe_7$ polyhedra (due to the lone pair of $Sn^{2+}$) and the zig-zag accordion-like geometry of slabs in the bc-plane. This implies a soft lattice which, if mechanically stressed along the b and c directions, would not directly change the Sn—Se bond length, but instead the zig-zag geometry would allow it to be deformed like a retractable spring. In addition along the a direction the weaker bonding between SnSe slabs makes it a good stress buffer or a "cushion", thus dissipating phonon transport laterally[28]. The anomalously high Grüneisen parameter is therefore a consequence of "soft" bonding in SnSe, which leads to the very low lattice thermal conductivity.

Using our DFT calculated quantities (Debye temperatures, and phonon velocities) in the amorphous limit equation[29], we can calculate the minimum lattice thermal conductivity of the three directions (a, b, and c axis) at 770 K: $\kappa_{min}^a=0.256$ Wm$^{-1}$K$^{-1}$, $\kappa_{min}^b=0.360$ Wm$^{-1}$K$^{-1}$ and $\kappa_{min}^c=0.326$ Wm$^{-1}$K$^{-1}$. The trend of the theoretically predicted minimum thermal conductivity is in good agreement with the experimental measurements ($\kappa_{lat}^a<\kappa_{lat}^c<\kappa_{lat}^b$). The theoretically calculated minimal thermal conductivities are slightly larger than those from experimental measurements, which could possibly result from (1) the value of Lorenz number $1.5\times10^{-8}$V$^2$K$^2$, which can well vary from 1 to $2.4\times10^{-8}$V$^2$K$^2$; (2) the values of the diffusivity, which depends on the details of a fit to time-dependent reflectivity curves (the instrumental probably span 5% or more); (3) the sample thickness, the homogeneity of that thickness, and the sample density; and 4) the fact that it is difficult to measure precisely along one crystallographic axis. Indeed, the EBSD analysis shows about a ~11 degree angular deviation of the crystallographic axes from the surface normal.

Figure 4C:
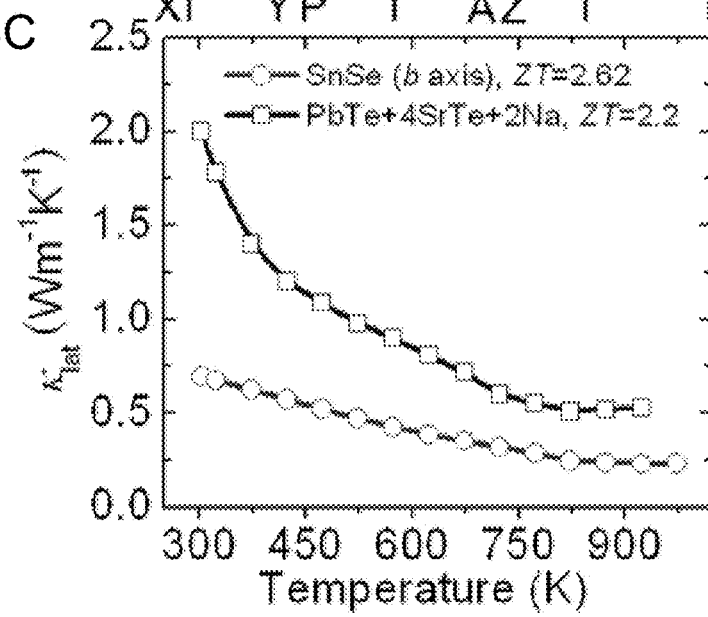
FIG. 4C. The lattice thermal conductivity comparison of SnSe along its b axis ($ZT_{max}$=2.62) and hierarchical architectured PbTe-4SrTe-2Na ($ZT_{max}$=2.2)[11].

It is interesting at this point to compare the lattice thermal conductivity of SnSe with state-of-the-art thermoelectric systems. The previously reported nanostructured all-scale hierarchical PbTe-4SrTe-2Na with ZT of 2.2 exhibits a lattice thermal conductivity of 0.5 Wm$^{-1}$K$^{-1}$, see FIG. 4C. The unprecedented ZT~2.62 of SnSe comes principally from an even lower lattice thermal conductivity of 0.25 Wm$^{-1}$K$^{-1}$ despite the lack of nanostructuring. We find good experimental repeatability for this high ZT, as evidenced by measurements on seven separate crystals prepared independently.

The ZT~2.62 at 923K in SnSe crystals demonstrates that bulk materials with layered structures, anharmonic bonding and intrinsically ultralow thermal conductivity are promising candidates for high thermoelectric performance. It is remarkable that this ultralow thermal conductivity can be realized in a simple compound such as SnSe since it does not have high molecular weight, or a complex crystal structure, or large unit cell. These attributes are generally associated with low thermal conductivity. Compared to other high performance thermoelectrics our results for SnSe demonstrate that a high ZT also can be realized in simple layered, anisotropic, and anharmonic systems, without nanostructuring.

METHODS SUMMARY

The SnSe samples were synthesized first in the form of ingots by heating to 1223K over 9.5 h and soaking for 6 h, and then furnace cooling to room temperature, followed by a Bridgman crystal growth by heating to 1223K over 9.5 h, and then cooling from 1223 K to room temperature at a rate of 2 mmh$^{-1}$. The σ and S were measured simultaneously in a helium atmosphere at 300K-973K on a ULVAC-RIKO ZEM-3 instrument system. We determined carrier concentrations using a homemade apparatus at 300K-823 K. The thermal diffusivity, D, was directly measured at 300K-973K by using the laser flash diffusivity method in a commercial Netzsch LFA-457 instrument. The thermal diffusivity was measured along the same direction as was the electrical transport. The heat capacity, $C_p$, was indirectly derived using a representative sample (Pyroceram 9606) in the range 300K-973K. The total thermal conductivity was calculated using the formula: $\kappa=D\cdot C_p\cdot\rho$, where ρ is the sample density, which was determined using the dimensions and mass of the sample and then reconfirmed measured by gas pycnometer (Micromeritics AccuPyc 1340). Transmission Electron Microscope investigation was conducted with JEOL 2100F at 200 kV. The phonon and Grüneisen dispersions were calculated by using first-principles density-functional theory (DFT) phonon calculations within the quasi-harmonic approximations.

Methods

Starting Materials:

Sn chunk (99.999%, American Elements, US) and Se shot (99.999%, 5 N Plus, Canada).

Bridgman Crystal Grown:

Ingots (~20 g) with nominal compositions of SnSe were synthesized by mixing appreciated ratios of high purity starting materials of Sn and Se in quartz tubes. The tubes were evacuated to a pressure of ~10$^{-4}$ torr, flame-sealed, slowly heated to 1223 K in 10 h, soaked at this temperature for 6 h and subsequently furnace cooling to room temperature. The temperature of 1223 K (950° C.) is determined by differential thermal analysis (DTA) of SnSe. The obtained ingots were crushed into powders and charged into a quartz tube, evacuated and flame-sealed. The quartz tube was placed into another bigger quartz tube, evacuated and flame-sealed. The outer tube is used to prevent the crystals from oxidizing air if the inner tube breaks owing to considerable difference of thermal expansion between the crystal and quartz. Near-fully dense samples were achieved. The SnSe crystals with dimensions of 13 mm (diameter)×20 mm (length) were obtained. A good experimental repeatability was evidenced by seven crystals with excellent quality in terms of showing shining flat surfaces, no cracks or obvious defects, and no porosity or other macroscopic features.

Electrical Properties:

The obtained SnSe single crystals were cut into bars along different directions with dimensions of 10 mm×2.5 mm×2.5 mm. These were used for simultaneous measurement of the Seebeck coefficient and electrical conductivity using an UlvacRiko ZEM-3 instrument under a helium atmosphere from room temperature to 973 K. The uncertainty of the Seebeck coefficient and electrical conductivity measurements is 5%, and is about 10% for the power factor, considering the uncertainties for the Seebeck coefficient and electrical conductivity.

Hall Measurements:

High temperature Hall coefficients were measured with a homemade high temperature apparatus, which provides a working range from 300 to 823 K. The sample with dimensions 8 mm×3 mm×1 mm was press mounted and protected with argon gas to avoid possible oxidation at high temperature. The Hall resistance was monitored with a Linear Research AC Resistance Bridge (LR-700), with constant magnetic fields of ±1 T applied by using an Oxford Superconducting Magnet.

Thermal Conductivity:

High density SnSe crystals were cut and polished into coins of Ø~8 mm (or rectangular sample with side length of 6 mm) and 1-2 mm thickness for thermal diffusivity measurements along different directions. The samples were coated with a thin layer of graphite to minimize errors from the emissivity of the material. The thermal conductivity was calculated from $\kappa = D \cdot C_p \cdot \rho$, where the thermal diffusivity coefficient (D) was measured along the same direction as was the electrical transport using the laser flash diffusivity method in a Netzsch LFA457, the specific heat capacity ($C_p$) was indirectly derived using a representative sample (Pyroceram 9606) in the range from room temperature to 973K, and the density ($\rho$) was determined using the dimensions and mass of the sample and then reconfirmed using a gas pycnometer (Micromeritics AccuPyc1340) measurements. The thermal diffusivity data were analyzed using a Cowan model with pulse correction and heating and cooling cycles give reproducible values for each sample. The uncertainty of the thermal conductivity is estimated to be within 5%, considering the uncertainties for D, $C_p$ and $\rho$. The combined uncertainty for all measurements involved in the calculation of ZT is around 15%.

Band Gap Measurements:

Room temperature optical diffuse reflectance measurements were performed on finely ground powders to probe optical energy gap of the series. The measurements were performed using a Shimadzu Model UV-3101PC double-beam, double-monochromator spectrophotometer (Ultraviolet-Visible absorption Spectroscopy). $BaSO_4$ was used as a 100% reflectance standard. The generated reflectance versus wavelength data were used to estimate the band gap by converting reflectance to absorption data according to Kubelka-Munk equations: $\alpha/S = (1-R)^2/(2R)$, where R is the reflectance and $\alpha$ and S are the absorption and scattering coefficients, respectively.

Differential Thermal Analysis (DTA):

Differential thermal analysis was performed with a computer-controlled Shimadzu DTA-50 thermal analyzer. The ground SnSe crystal (~30 mg total mass) was sealed in fused quartz ampoule under vacuum. An ampoule containing $\alpha$-$Al_2O_3$ of equal mass was sealed and placed on the reference side of the detector. The SnSe sample and reference were heated to 1173K at a rate of 3° C./min and cooled at a rate of 3° C./min to 50° C. DTA measurements were run for two circles.

Transmission Electron Microscopy (TEM):

Transmission electron microscope investigation was conducted with JEOL 2100F at 200 kV. Gatan double-tilt heating stage was used to carry out the in-situ heating experiments. In-situ experiment was conducted under fast temperature ramping rate (20K/min) and more than 30 minutes incubation time. TEM samples were prepared by standard conventional method with polishing, dimpling, and Ar-ion-milling. Crystal Maker and Single Crystal were used to simulate the crystal structure and diffraction patterns.

Electron Backscattering Scatter Diffraction (EBSD):

The EBSD investigation was conducted under FEI Quanta ESEM equipped with Aztec and Oxford CHANNEL 5 software for data collection and analysis, respectively. Sample was polished until mirror-like and the data was collected at a 1 $mm^2$ area.

X-Ray Diffraction (XRD):

The sample with cleavage plane and the samples pulverized with an agate mortar were used respectively for powder X-ray diffraction (XRD). The powder diffraction patterns were obtained with Cu $K_\alpha$ ($\lambda = 1.5418$ Å) radiation in a reflection geometry on an Inel diffractometer operating at 40 kV and 20 mA and equipped with a position-sensitive detector.

Density-Functional Theory Calculations:

We performed DFT calculations using the Vienna Ab Initio Simulation Package (VASP)[31] with the projector augmented wave (PAW) scheme, and the generalized gradient approximation of Perdew, Burke and Ernzerhof (GGA-PBE)[32] for the electronic exchange-correlation functional. The energy cutoff for the plane wave expansion is 500 eV. The Brillouin zones of SnSe are sampled by Monkhorst-Pack[33] k-point meshes of (4×12×12). Atomic positions and unit cell vectors are relaxed until all the forces and components of the stress tensor are below 0.01 eV/Å and 0.2 kbar, respectively. Vibrational properties are calculated using the supercell (112 atoms in the SnSe supercell) force constant method by ATAT[34]. In the quasiharmonic DFT phonon calculations, the system volume is isotropically expanded by +2% from the DFT relaxed volume. The Grüneisen parameter ($\gamma$) is defined as, $$\gamma_i = -\frac{V}{\omega_i}\frac{\partial \omega_i}{\partial V},$$

which characterizes the relationship between phonon frequency and volume change. The Grüneisen parameters provide an estimate of the strength of the anharmonicity in a compound. The minimum lattice thermal conductivity can be calculated using the approach developed by Cahill[35]:

$$\kappa_{min} = \left(\frac{\pi}{6}\right)^{1/3} k_B n^{2/3} \sum_i v_i \left(\frac{T}{\Theta_i}\right)^2 \int_0^{\Theta_i/T} \frac{x^3 e^x}{(e^x-1)^2}dx,$$

where v, $\Theta$ and n are the phonon velocity, Debye temperature and the number density of atoms, respectively.

References for Background, Detailed Description and Example 1

1. Heremans, J. P., Dresselhaus, M. S., Bell, L. E. & Morelli, D. T. When thermoelectrics reached the nanoscale. *Nature Nano.* 8, 471-473 (2013).
2. Sootsman, J. R., Chung, D. Y. & Kanatzidis, M. G. New and old concepts in thermoelectric materials. *Angew. Chem. Int. Ed.* 48, 8616-8639 (2009).
3. Snyder, G. J. & Toberer, E. S. Complex thermoelectric materials. *Nature Mater.* 7, 105-114 (2008).
4. Dresselhaus, M. S., Chen, G., Tang, M. Y., Yang, R. G., Lee, H., Wang, D. Z., et al. New directions for low-dimensional thermoelectric materials. *Adv. Mater.* 19, 1043-1053 (2007).
5. Heremans, J. P., Jovovic, V., Toberer, E. S., Saramat, A., Kurosaki, K., Charoenphakdee, A., et al. Enhancement of thermoelectric efficiency in PbTe by distortion of the electronic density of states. *Science* 321, 554-557 (2008).
6. Pei, Y., Shi, X., LaLonde, A., Wang, H., Chen, L. & Snyder, G. J. Convergence of electronic bands for high performance bulk thermoelectrics. *Nature* 473, 66-69 (2011).
7. Liu, W., Tan, X., Yin, K., Liu, H., Tang, X., Shi, J., et al. Convergence of conduction bands as a means of enhancing thermoelectric performance of n-type $Mg_2Si_{1-x}Sn_x$ solid solutions. *Phys. Rev. Lett.* 108, 166601 (2012)
8. Hicks, L. D. & Dresselhaus, M. S. Effect of quantum-well structures on the thermoelectric figure of merit. *Phys. Rev. B* 47, 12727-12731 (1993).
9. Heremans, J. P., Thrush, C. M. & Morelli, D. T. Thermopower enhancement in lead telluride nanostructures. *Phys. Rev. B* 70, 115334 (2004).

10. Hsu, K. F., Loo, S., Guo, F., Chen, W., Dyck, J. S., Uher, C., et al. Cubic AgPb$_m$SbTe$_{2+m}$: Bulk thermoelectric materials with high figure of merit. *Science* 303, 818-821 (2004).
11. Biswas, K., He, J., Blum, I. D., Wu, C. I., Hogan, T. P., Seidman, D. N., et al. High-performance bulk thermoelectrics with all-scale hierarchical architectures. *Nature* 489, 414-418 (2012).
12. Biswas, K., He, J., Zhang, Q., Wang, G., Uher, C., Dravid, V. P., et al. Strained endotaxial nanostructures with high thermoelectric figure of merit. *Nature Chem.* 3, 160-166 (2011).
13. Zhao, L. D., Hao, S., Lo, S. H., Wu, C. I., Zhou, X., Lee, Y., et al. High thermoelectric performance via hierarchical compositionally alloyed nanostructures. *J. Am. Chem. Soc.* 135, 7364-7370 (2013).
14. Zhao, L. D., He, J., Hao, S., Wu, C. I., Hogan, T. P., Wolverton, C., et al. Raising the thermoelectric performance of p-Type PbS with endotaxial nanostructuring and valence-band offset engineering using CdS and ZnS. *J. Am. Chem. Soc.* 134, 16327-16336 (2012).
15. Brown, S. R., Kauzlarich, S. M., Gascoin, F. & Snyder, G. J. Yb$_{14}$MnSb$_{11}$: New high efficiency thermoelectric material for power generation. *Chem. Mater.* 18, 1873-1877 (2006).
16. Kurosaki, K., Kosuga, A., Muta, H., Uno, M. & Yamanaka, S. Ag$_9$TlTe$_5$: A high-performance thermoelectric bulk material with extremely low thermal conductivity. *Appl. Phys. Lett.* 87, 061919 (2005).
17. Rhyee, J.-S., Lee, K. H., Lee, S. M., Cho, E., Il Kim, S., Lee, E., et al. Peierls distortion as a route to high thermoelectric performance in In$_4$Se$_{3-\delta}$ crystals. *Nature* 459, 965-968 (2009).
18. Yu, J. G., Yue, A. S. & Stafsudd, O. M. Growth and electronic properties of the SnSe semiconductor. *J. Cryst. Growth* 54, 248-252 (1981).
19. Wasscher, J. D., Albers, W. & Haas, C. Simple evaluation of the maximum thermoelectric figure of merit, with application to mixed crystals SnS$_{1-x}$Se$_x$. *Solid-State Electron.*, 6, 261-264 (1963).
20. Peters, M. J. & McNeil, L. E. High-pressure mossbauer study of SnSe. *Phys. Rev. B* 41, 5893-5897 (1990).
21. Chattopadhyay, T., Pannetier, J. & Vonschnering, H. G. Neutron-diffraction study of the structural phase-transition in SnS and SnSe. *J. Phys. Chem. Solids* 47, 879-885 (1986).
22. Baumgardner, W. J., Choi, J. J., Lim, Y.-F. & Hanrath, T. SnSe nanocrystals: synthesis, structure, optical properties, and surface chemistry. *J. Am. Chem. Soc.* 132, 9519-9521 (2010).
23. Morelli, D. T., Jovovic, V. & Heremans, J. P. Intrinsically minimal thermal conductivity in cubic I-V-VI$_2$ semiconductors. *Phys. Rev. Lett.* 101, 035901 (2008).
24. Fultz, B. & Howe, J. M. *Transmission electron microscopy and diffractometry of materials* (Springer, 2012).
25. Nielsen, M. D., Ozolins, V. & Heremans, J. P. Lone pair electrons minimize lattice thermal conductivity. *Energ. Environ. Sci.* 6, 570-578 (2013).
26. Zhang, Y. S., Skoug, E., Cain, J., Ozolins, V., Morelli, D. & Wolverton, C. First-principles description of anomalously low lattice thermal conductivity in thermoelectric Cu—Sb—Se ternary semiconductors. *Phys. Rev. B* 85, 054306 (2012).
27. Slack, G. A. in *Solid State Physics* (ed. Seitz, F. et. al.) 1-71 (New York: Academic Press, 1979).
28. Clarke, D. T. Materials selection guidelines for low thermal conductivity thermal barrier coatings, *Surf Coat. Tech.* 163-164, 67-74 (2003).
29. Cahill, D. G., Watson, S. K. & Pohl, R. O. Lower limit to the thermal conductivity of disordered crystals. *Phys. Rev. B* 46, 6131-6140 (1992).
31. Kresse G, Joubert D. From ultrasoft pseudopotentials to the projector augmented-wave method. *Physical Review B* 1999, 59(3): 1758-1775.
32. Perdew J P, Burke K, Ernzerhof M. Generalized gradient approximation made simple. *Physical Review Letters* 1996, 77(18): 3865-3868.
33. Monkhorst H J, Pack J D. Special points for Brillouin-Zone integrations. *Physical Review B* 1976, 13(12): 5188-5192.
34. van de Walle A., Asta M., Ceder G. The alloy theoretical automated toolkit: A user guide. CALPHAD 2002, 26: 539-553.
35. Cahill, D. G., Watson, S. K. & Pohl, R. O. Lower limit to the thermal conductivity of disordered crystals. *Phys. Rev. B* 46, 6131-6140 (1992).

Example 2

This example demonstrates an ultrahigh PF in holed-doped SnSe due to exceptional electronic conductivity and Seebeck coefficient. This ultrahigh PF coupled with the intrinsically low thermal conductivity of SnSe[1] results in a reproducible, unprecedented average ZT~2.1 (from 300-923K) along the b axis of SnSe, with ZT ranging from 0.9 at 300K to 2.6 at 973K. We attribute this exceptional performance to the synergistic roles of hole-doping: i) increase of electrical conductivity by 100 times up to ~1480 Scm$^{-1}$ at 300K at a hole concentration of ~4×10$^{19}$ cm$^{-3}$, and ii) concomitant lowering of the Fermi energy accessing multiple electronic valence bands in the material, enabling a large Seebeck coefficient ~+160 µVK$^{-1}$ at 300K. Collectively, this results in a large PF of ~40 µWcm$^{-1}$K$^{-2}$ at 300 K and ~12 µWcm$^{-1}$K$^{-2}$ at 973 K along the b axis.

Sodium was used as an effective acceptor for hole doping SnSe and a vast increase in ZT, compared to the undoped sample, along the b axis was found to occur at room temperature, while maintaining the ZT$_{max}$ of 2.6 at high temperatures. Hole doping produces a material with a very high PF and ZT over a remarkably broad temperature range from 300-973K and as a result gives the highest average ZT (ZT$_{ave}$) known in the field of thermoelectric materials of ~2.1. This is about 32%, 65% and 148% higher than PbTe$_{0.7}$S$_{0.3}$-2.5% K (ZT$_{ave}$~1.56)[19], PbTe-4SrTe-2Na (ZT$_{ave}$~1.25)[15] and undoped SnSe (ZT$_{ave}$~0.83)[1] from 300K to 923K. While it is the extremely low thermal conductivity that enables the high ZT of undoped SnSe crystals from 723-973K, in hole doped SnSe the impressive ZT$_{ave}$ enhancement is attributed to the enormous boost in PF from 300-723K. This boost comes from the multiple valence bands able to contribute to the Seebeck coefficient as the Fermi level moves down in energy through hole doping. The calculated conversion efficiency (from Eq. (1) below) for the thermoelectric power generation of hole doped SnSe is about 24.4%, which is the highest reported so far. Conversion of wasted heat to electricity, even at modest fractions, can improve significantly the overall efficiency of energy utilization in the world and significantly decrease carbon emissions. Therefore, the prospects for the realization of very efficient devices using hole doped SnSe as a p-type dopant are significant.

FIG. 5A shows the ZT values along different axial directions of hole doped SnSe compared side by side with those of undoped SnSe[1]. It can be readily seen that the ZT values of undoped SnSe (b axis) are low in the range 300-723K, varying from 0.1 to 0.9, giving an overall low $ZT_{ave}$. We note that it is $ZT_{ave}$ (not $ZT_{max}$) over the entire working temperature range that defines the thermoelectric conversion efficiency, see Eq (1)[20,21]. It is striking that the $ZT_{max}$ values of the hole doped SnSe system along the b axis increase from 0.1 to 0.9 at room temperature and from 0.9 to 2.6 between 300-723K. The corresponding ZT along the c axis varies from 0.8 at 300K to 2.2 at 723K. After a slight dip around 800 K, due to the structural phase transition from the Pnma to Cmcm structure[1], the ZT values continue to increase with temperature and reach 2.6 for the b axis, 2.3 for c axis and 1.4 for the a-axis, at 973K, respectively.

$$\eta = \frac{T_h - T_c}{T_h}\left[\frac{\sqrt{1+ZT_{ave}}-1}{\sqrt{1+ZT_{ave}}+T_c/T_h}\right] \quad (1)$$

Figure 5D:
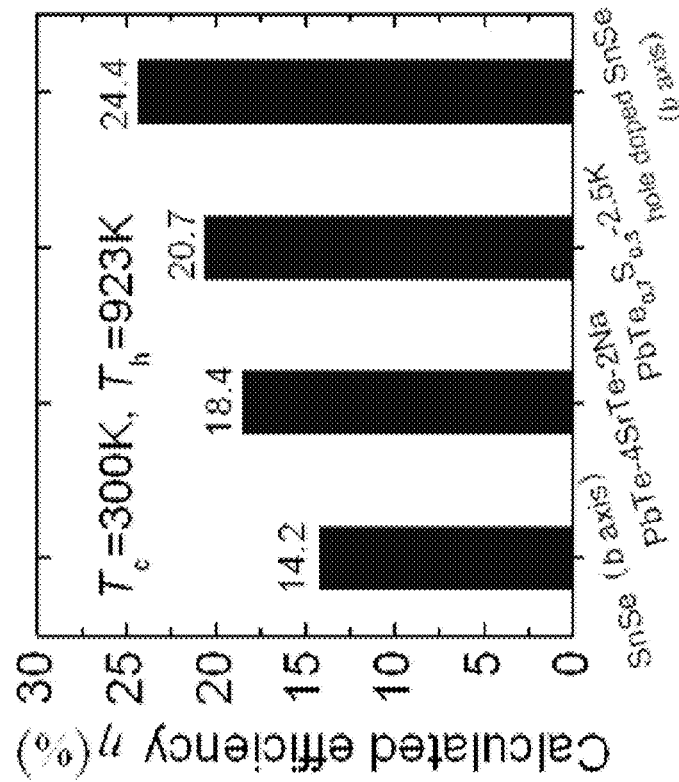
FIG. 5D. The calculated efficiency comparison of hole doped SnSe (b axis), SnSe (b axis)[1], PbTe-4SrTe-2Na[15], and PbTe$_{0.7}$S$_{0.3}$-2.5K[19].
Figure 5C:
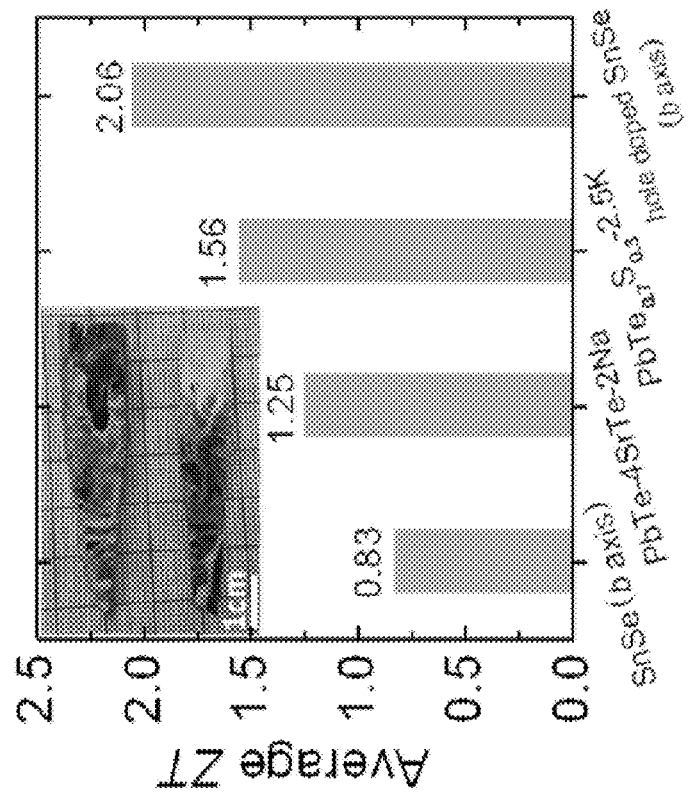
FIG. 5C. Average ZT values comparison of hole doped SnSe (b axis), SnSe (b axis)[1], PbTe-4SrTe-2Na[15], and PbTe$_{0.7}$S$_{0.3}$-2.5K[19]; the inset shows the typical hole doped SnSe crystals. The temperature range for these values is from 300-923K.

The corresponding properties of top p-type examples Bi—Sb—Te ($ZT_{max}$~1.4 at 373K)[22], MgAgSb ($ZT_{max}$~1.4 at 475K)[14], NaPb$_m$SbTe$_{m+2}$ (SALT) ($ZT_{max}$~1.5 at 650K)[10], PbTe-4SrTe-2Na ($ZT_{max}$~2.2 at 915K)[15] and SnSe (b axis) ($ZT_{max}$~2.6 at 923K)[1] are shown in FIG. 5B. It can be seen that the thermoelectric performance of hole doped SnSe (b axis) outperforms all current state-of-the-art p-type materials[1,10,14,15,22]. FIG. 5C shows the $ZT_{ave}$ comparisons of hole doped SnSe (b axis), undoped SnSe (b axis)[1], PbTe-4SrTe-2% Na[15], and PbTe$_{0.7}$S$_{0.3}$-2.5% K[19] over the same range of 300-923K. From 300 to 923K the $ZT_{ave}$ for hole doped SnSe (b axis) is as high as 2.1, versus 0.83 for undoped SnSe crystals (b axis)[1]. The inset of FIG. 5C shows typical crystals of hole doped SnSe, which cleave along the bc-plane direction as determined by X-ray diffraction (XRD). For comparison, FIG. 5D shows the maximum expected conversion efficiency (ii) for top materials. The b axis direction of hole doped SnSe promises the highest calculated efficiency of 24.4%, compared to 14.2% for SnSe (b axis)[1], 18.4% for PbTe-4SrTe-2Na[15], and 20.7% for PbTe$_{0.7}$S$_{0.3}$-2.5K[19].

We next investigated the various contributions to ZT, in an effort to understand the physical origins of the increase in thermoelectric efficiency. As shown in FIG. 6A, the electrical conductivity of SnSe is significantly increased by hole doping, from 10-12 Scm$^{-1}$ to 1200-1400 Scm$^{-1}$. The temperature dependence of the electrical conductivity changes from semiconductor-like in undoped samples to metallic-like in the hole doped samples. With rising temperature the electrical conductivity of hole doped SnSe (b axis) decreases from 1480 Scm$^{-1}$ at 300K to 123 Scm$^{-1}$ at 973K, but it is still much higher than the 74 Scm$^{-1}$ at 973K for undoped SnSe (b axis)[1]. Using low temperature Hall data (discussed below) the carrier density was estimated at ~4×10$^{19}$ cm$^{-3}$ based on the single parabolic band model. The Seebeck coefficients are ~+160 μVK$^{-1}$ at 300K (similar to that of Bi$_{1-x}$Sb$_x$Te$_3$ for similar hole concentrations)[21] and increase to ~+300 μVK$^{-1}$ at 973K, FIG. 6B.

Figure 6D:
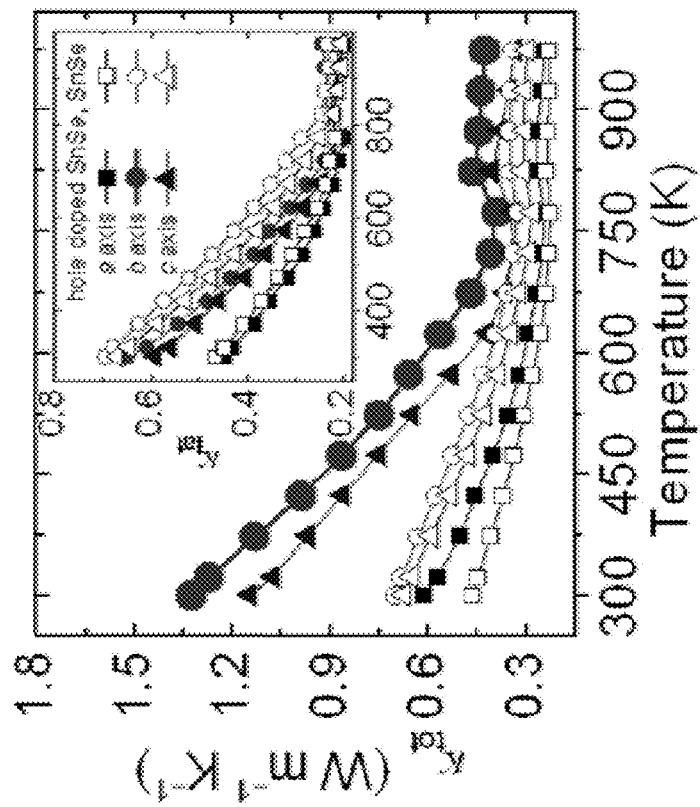
FIG. 6D. Total thermal conductivity as a function of temperature for hole doped SnSe crystals; the inset is the lattice thermal conductivity.
Figure 6C:
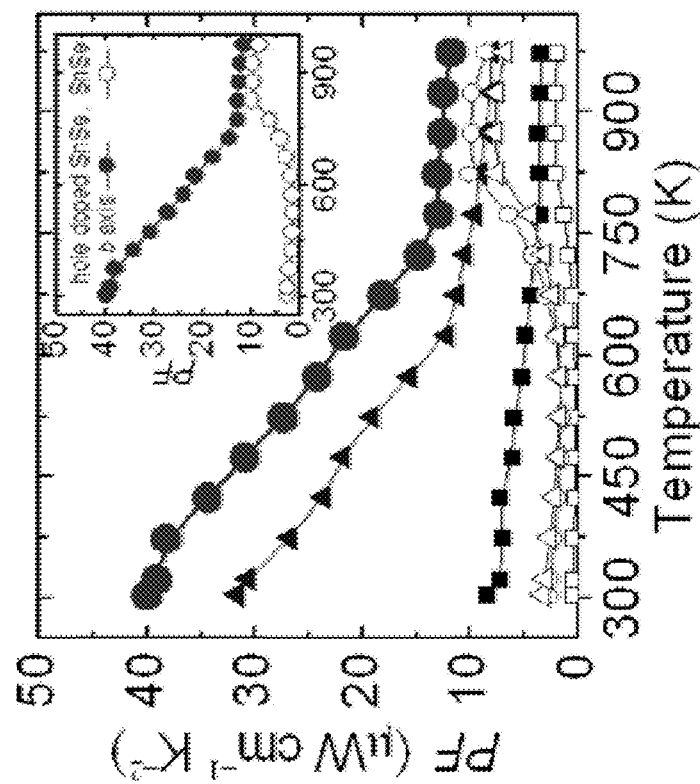
FIG. 6C. PF as a function of temperature for hole doped SnSe crystals; the inset shows the PF comparison of hole doped SnSe and undoped SnSe along the b axis.

The combination of increased electrical conductivity and high Seebeck coefficient results in an impressively high PF of ~40 μWcm$^{-1}$K$^{-2}$ for hole doped SnSe (b axis) at 300 K, FIG. 6C. This value rivals that of optimized p-type Bi$_{1-x}$Sb$_x$Te$_3$ along its ab– crystallographic plane direction[21]. The PFs remain at a high value of ~12 μWcm$^{-1}$K$^{-2}$ around 973 K for hole doped SnSe (b axis), which is higher than that of ~10 μWcm$^{-1}$K$^{-2}$ for the undoped SnSe (b axis), see FIG. 6C (inset). The maximum PFs at 300 K along the c and a directions of hole doped SnSe are ~30 μWcm$^{-1}$K$^{-2}$ and ~10 μWcm$^{-1}$K$^{-2}$, respectively. Therefore, the main contribution to the huge enhancement of ZT from 300-700K is the superior PF.

The total thermal conductivity ($\kappa_{tot}$) of hole doped SnSe is very low and shows a decreasing trend with rising temperature, FIG. 6D. The $\kappa_{tot}$ of hole doped SnSe (b axis) decreases from ~1.3 Wm$^{-1}$K$^{-1}$ at 300K to ~0.42 Wm$^{-1}$K$^{-1}$ at 973K. The $\kappa_{lat}$ of hole doped SnSe is as low as that of undoped SnSe and this is due to the large Grüneisen parameters of the SnSe structure caused by strong anharmonic bonding[1]. Additional contributions from point defect scattering[23] arising from Na doping makes the $\kappa_{lat}$ of hole doped SnSe somewhat lower than that of undoped SnSe, resulting in values of ~0.3 Wm$^{-1}$K$^{-1}$ at 973K.

The $ZT_{max}$ values and the unprecedented $ZT_{ave}$ of 2.1 for hole doped SnSe (b axis) are mainly attributed to the vastly improved PF. It is noteworthy that the PFs achieved in hole doped SnSe are much higher than those in the rock-salt lead and tin chalcogenides[18,24-26], especially in the 300-500K range. These high PFs derive from the much larger Seebeck coefficient since the electrical conductivity of hole doped SnSe (b axis) is comparable to those rock-salt chalcogenides. To investigate the scientific underpinning of the significantly enlarged Seebeck coefficients and PFs, the room temperature Seebeck coefficients of rock-salt chalcogenides with similar carrier density of ~4×10$^{19}$ cm$^{-3}$ are plotted, as shown in FIG. 3A (similar to a Pisarenko plot). Clearly, the Seebeck coefficient for hole doped SnSe at ~+160 μVK$^{-1}$, is much higher than the ~+70 μVK$^{-1}$ for PbTe[18], ~+60 μVK$^{-1}$ for PbSe[24], ~+50 μVK$^{-1}$ for PbS[25], and ~+25 μVK$^{-1}$ for SnTe[26].

Figure 7B:
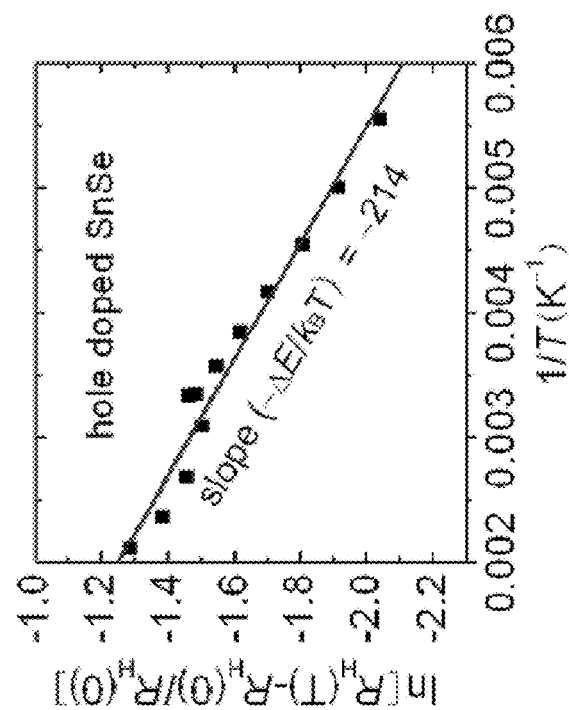
FIG. 7B. ln [$R_H$(T)−$R_H$(0)]/$R_H$(0) as a function of 1/T for hole doped SnSe, with the solid lines calculated by best linearly fitting the data. The slope (−ΔE/$k_B$T) of −214 yields the energy gap between two valence bands, ΔE~0.02 eV.
Figure 7A:
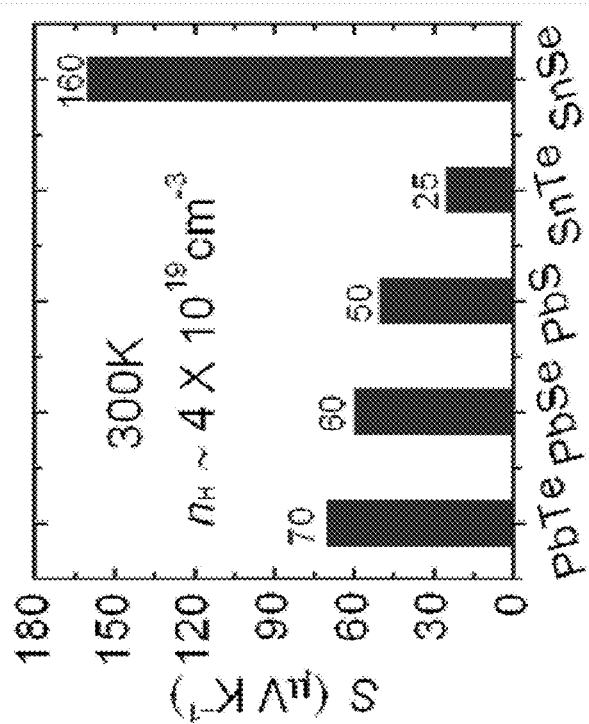
FIG. 7A. Room temperature Seebeck coefficients comparison for lead and tin chalcogenides[18,24-26] with carrier densities of ~4×10$^{19}$ cm$^{-3}$.

For hole doped PbTe and PbSe it is well known that the Fermi level is pushed into the second so-called heavy valence band by heavy doping[18], and the Seebeck coefficient is enhanced by involving the contribution of the heavy valence band. This enhancement, however, is only noticed at high temperatures because the energy difference between the two valence bands in PbTe and PbSe is 0.15 and 0.25 eV and the extra contribution of the heavy valence band and requires a carrier density of ~4-5×10$^{19}$ cm$^{-3}$ and 1-2×10$^{20}$ cm$^{-3}$ at 300K[16,18], respectively. For PbS and SnTe the energy difference between the two bands is even larger (>0.3 eV)[4,25,26]. FIG. 7A illustrates this comparison showing a Seebeck coefficient decreasing trend from PbTe, PbSe, PbS to SnTe. The large Seebeck coefficient of ~+160 μVK$^{-1}$ observed (already at 300K) for the hole doped SnSe is much higher than one would expect from a single band contribution (~35-40 μVK$^{-1}$) and strongly suggests that more than one valence band is contributing to it.

The Hall data ($R_H$) is consistent with multi-band transport as it shows a significant continuous increase with temperature in the range 10-823K. The values of $R_H$ of hole doped SnSe as a function of temperature are therefore not temperature independent, ruling out the single band model of transport. The Hall data implies that the multiple band convergence of hole doped SnSe being in effect already at very low temperatures. To estimate the energy gap (ΔE) between the first two bands, we used the well-developed model for a typical two-band compound to analyze the Hall data. In this model, the temperature dependent $R_H$(T) can be expressed as[18]:

$$\frac{R_H(T) - R_H(0)}{R_H(0)} = \left(1 - \frac{\mu_2}{\mu_1}\right)^2 \left(\frac{m_2}{m_1}\right)^{3/2} e^{-\frac{\Delta E}{k_B T}} \quad (2)$$

where $R_H(0)$ represents the Hall coefficient at 0 K, $\mu_1$, $\mu_2$, and $m_1$, $m_2$ denote the carrier mobilities and density of states effective masses of the first and the second valence band, respectively, $k_B$ is the Boltzmann constant, and $\Delta E$ is the energy separation between the two VBMs. As shown in FIG. 7B, the slope of $$\left(-\frac{\Delta E}{k_B T}\right)$$

of ln $[R_H(T)-R_H(0)]/R_H(0)$ vs. 1/T yields a $\Delta E$~0.02 eV. This energy gap between the first two valence bands of SnSe is much smaller than in PbTe, PbSe, PbS and SnTe.[4, 18, 26, 27] Therefore, the band convergence for hole doped SnSe is expected at a much lower temperature than in the rock-salt lead chalcogenides. The $\Delta E$~0.02 eV value is comparable to $k_B T$ at room temperature suggesting the valence bands are nearly equal in energy and this is consistent with the much higher Seebeck coefficients and PFs observed at room temperature. As the temperature increases the carriers are thermally distributed over several bands, resulting in the enhanced Seebeck coefficient of ~+160 $\mu VK^{-1}$ at 300K for hole doped SnSe. These results are supported by the theoretical calculations discussed below.

It is known that SnSe has a low and a high temperature phase with a space group of Pnma and Cmcm respectively[1]. FIG. 7C shows the density functional theory (DFT) calculated electronic band structure the Pnma phase of SnSe, and the valence band maximum (VBM) which lies in the Γ-Z direction. Another valence band is located just below the VBM. And even a third band exists with its band maximum along the U-X direction. The calculation shows a very small energy gap between the first two valence bands in the Γ-Z direction of ~0.06 eV, a small value which is consistent with the estimated 0.02 eV. We find this slight energy difference between calculation and experiment to be quite reasonable given the approximations underlying the DFT calculations. Such a small energy gap is easily crossed by the Fermi level, as the doping approaches 4-5×10$^{19}$ cm$^{-3}$. In addition, the calculation results show that the energy gap between the first and the third band, i.e. maximum of U-X to the maximum Γ-Z, is only 0.13 eV. This value is even smaller than the 0.15 eV between the first and the second valence bands of PbTe, in which the band convergence occurs as the carrier density approaches 4-5×10$^{19}$ cm$^{-3}$. FIGS. 7D-F show the Fermi surface hole pockets for three different hole concentrations (5×10$^{19}$ cm$^{-3}$, 2×10$^{20}$ cm$^{-3}$, and 5×10$^{20}$ cm$^{-3}$). The Fermi surface appears to have multiple types of pockets coming from the several valence bands lying close in energy to one another as seen in FIG. 7C. This multitude of valence bands with similar energy is a distinctive feature of SnSe and is absent in the rock salt chalcogenides. The high performing hole-doped PbTe and PbSe materials do not achieve such a good band degeneracy and, as a result, their high ZTs and average ZTs are much lower than those hole doped SnSe.

Figures 8A, 8B:
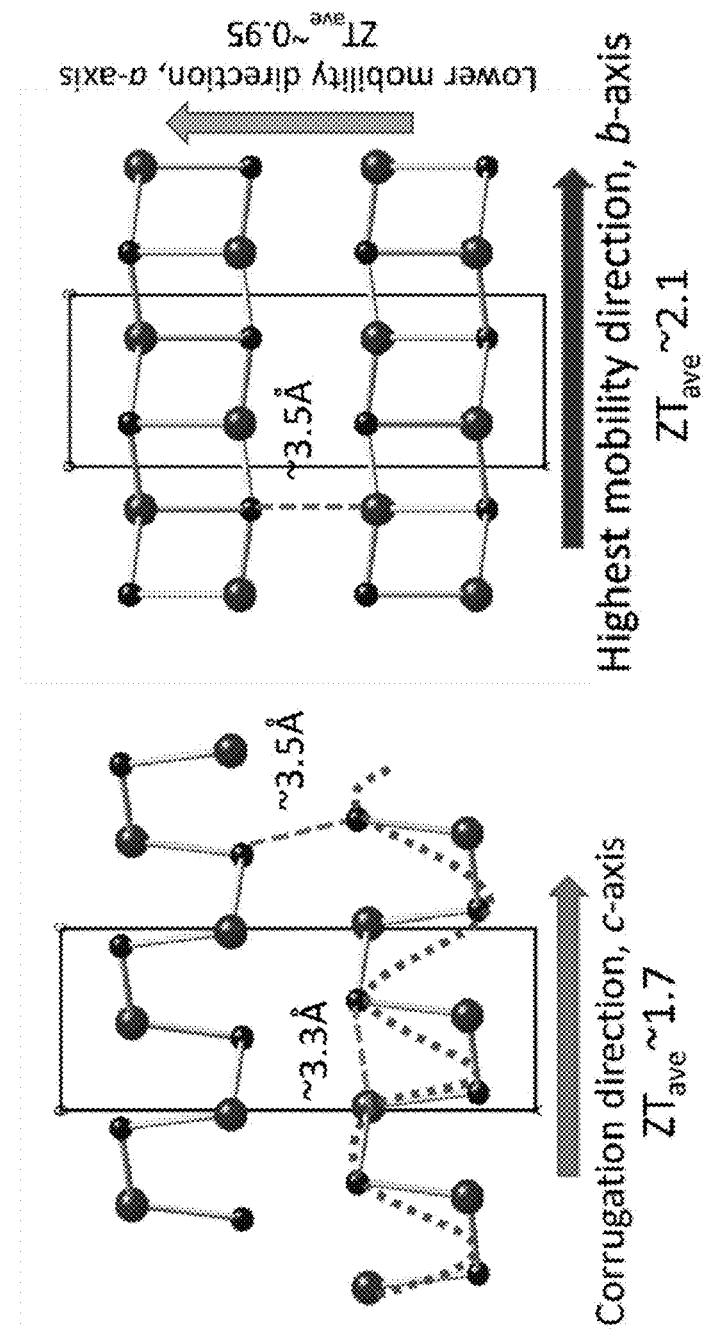
FIG. 8A. Crystal structure of SnSe shown along the c-axis direction. The dashed wiggly line is shown as a guide to the corrugation motif in the 2D slab. The closet Sn . . . Se interactions between the slabs are indicated with the dashed lines. The corrugation spacing within a single SnSe slab is also indicated with a dashed line. The arrows indicate the directions along which the $ZT_{ave}$ is marked.
FIG. 8B. Crystal structure of SnSe shown along the b-axis direction.

To get further insights into the origin of high Seebeck coefficients we compared our DFT-calculated effective mass of the top two valence bands with the experimental effective masses of PbTe, PbSe, and PbS. It is known that the longitudinal effective mass of PbTe $m_L^*$=0.31 $m_0$ (k vector along the Γ-L direction, where $m_0$ is the free electron mass) is about 10 times larger than the transverse mass $m_T^*$=0.022 $m_0$. For the PbSe and PbS $m_L^*$=0.068 $m_0$, $m_T^*$=0.064 $m_0$ and $m_L$=0.075 $m_0$, $m_T^*$=0.105$m_0$, respectively[28]. The SnSe effective masses at each valence band extremum are also anisotropic in agreement with previous calculations[29]. Due to the 2D nature of the material, the effective mass has a larger value along the $k_x$ direction (a axis) than either of the in-plane directions $k_y$ and $k_z$ (b and c axes). For the first valence maximum along Γ-Z, the effective masses are $m_{kx}^*$=0.76$m_0$, $m_{ky}^*$=0.33$m_0$, and $m_{kz}^*$=0.14$m_0$, which are much heavier than those of PbTe and PbSe. For the second maximum along Γ-Z, the $m_{kx}^*$=2.49$m_0$, $m_{ky}^*$=0.18$m_0$, and $m_{kz}^*$=0.19$m_0$, are even heavier than the first band. Those heavy holes play an important role in enhancing the Seebeck coefficients. Furthermore, since the Seebeck coefficients exhibit isotropic values along all three crystallographic directions, the different electrical conductivity values along these directions reflect the respective mobilities with the highest being along the b-axis. (The crystal structures for SnSe along the c-axial direction and b-axial direction are shown in FIGS. 8A and 8B, respectively. This is in agreement with the lightest effective masses associated with the b-axis, FIG. 8B. Compared with polycrystalline SnSe,[30,31] the higher carrier mobility in SnSe single crystals is a crucial factor that determines a high power factor and ZT performance.

The 2D sheets in SnSe are strongly corrugated and at the same time are well separated from one another with long inter-sheet Sn . . . Se bonding interactions of ~3.5 Å, see FIGS. 8A and 8B. Also along the corrugation direction (c-axis) there are long Sn—Se bonding interactions of ~3.3 Å. As a result, the a- and c-directions create larger effective hole masses in the materials, whereas the b-direction, along which there is no corrugation and the Sn—Se bonds are shortest (~2.8 Å), features smaller effective masses.

The results reported here demonstrate that hole doping SnSe can push its Fermi level deep into the band structure activating multiple valence bands that lie close in energy, enabling significantly enhanced Seebeck coefficients and PFs. Therefore, the unique electronic band structure of SnSe is key to the record breaking thermoelectric performance of the doped samples over such a wide temperature plateau from 300-973K. We note that in undoped SnSe, the exceptional performance is essentially in the high-T Cmcm phase (because of the very low glass-like thermal conductivity), but in hole doped SnSe it is also in the low-T Pnma phase (because of the very high PF at all temperatures). In addition to the large ZT at high temperature, hole doped SnSe has a ZT~0.9 at room temperature which makes it a top room temperature thermoelectric nearly matching $Bi_{1-x}Sb_xTe_3$[22].

Methods

Starting Materials:

Sn chunk (99.999%, American Elements, US), Se shot (99.999%, 5N Plus, Canada) and Na chunk (99.999%, Aldrich, U.S.).

Bridgman Crystal Growth:

Ingots (~20 g) with nominal compositions of hole doped SnSe were synthesized by mixing appropriate ratios of high purity starting materials of Sn, Se and Na in carbon-coated fused silica tubes. The tubes were evacuated to a pressure of ~10$^{-4}$ torr, flame-sealed, slowly heated to 1223 K in 10 h, soaked at this temperature for 6 h and subsequently furnace cooled to room temperature. The obtained ingots were crushed into powders and charged into a conical carbon-coated silica tube, evacuated and flame-sealed. Then the conical silica tube was placed inside another bigger fused silica tube, which was then evacuated and flame-sealed. The outer tube is used to prevent the oxidation of the crystals by air because the inner tube can break owing to considerable difference of thermal expansion between the crystal and silica. The SnSe crystals with dimensions of 13 mm (diameter)×20 mm (length) were obtained. The manipulations and preparative steps were carried out in a purified $N_2$-atmosphere glove box with total $O_2$ and $H_2O$ levels <0.1 ppm.

Electrical Transport Properties:

The obtained hole doped SnSe crystals were cut into bars along different directions with dimensions of 10 mm×2.5 mm×2.5 mm. The bars were used for simultaneous measurement of the Seebeck coefficient and the electrical conductivity using an UlvacRiko ZEM-3 instrument under a helium atmosphere from room temperature to 973 K. The samples were coated with a thin (~0.1-0.2 mm) layer of boron nitride (BN) to protect the instruments. The manipulations and preparative steps have previously been explained in detail[25]. Heating and cooling cycles gave repeatable electrical properties. Electrical properties obtained from different slices cut from the same crystals were similar, attesting to the homogeneity of the samples. The uncertainty of the Seebeck coefficient and electrical conductivity measurements is 5%, and is about 10% for the power factor.

Hall Measurements:

The Hall measurement was performed on homemade apparatuses (University of Michigan). The low temperature Hall coefficients were carried out in the temperature range of 10-300 K on samples with dimensions of 6 mm×2 mm×1 mm in a cryostat equipped with a radiation shield using a Linear Research ac bridge with 16 Hz excitation in a magnet cryostat capable of fields up to 5 T. High temperature Hall coefficients were measured with a homemade high temperature apparatus, which provided a working range from 300 to 823 K. The sample with dimensions of 8 mm×3 mm×1 mm was mounted and protected with an argon gas atmosphere to avoid possible oxidation at high temperature. The Hall resistance was monitored with a Linear Research AC Resistance Bridge (LR-700), with constant magnetic fields of ±1 T, applied by using an Oxford Superconducting Magnet.

Thermal Conductivity:

The hole doped SnSe crystals were cut and polished into rectangular samples with side lengths of 6 mm and ~2 mm thicknesses for thermal diffusivity measurements along different directions. The samples were coated with a thin layer of graphite to minimize errors from the emissivity of the material. The thermal conductivity was calculated from $\kappa = D \cdot C_p \cdot \rho$, where the thermal diffusivity coefficient (D) was measured along the same direction as the electrical transport using the laser flash diffusivity method in a Netzsch LFA457. The thermal diffusivity coefficient (D) was re-measured using the laser flash diffusivity method in a Netzsch LFA427; the specific heat capacity ($C_p$) was indirectly derived using a representative sample (Pyroceram 9606) in the range from room temperature to 973K. The $C_p$ results show good agreement with the reported values[1, 32]. The density ($\rho$) was determined using the dimensions and mass of the sample and then reconfirmed using gas pycnometer (Micromeritics AccuPyc1340) measurements. The thermal diffusivity data were analyzed using a Cowan model with pulse correction. Heating and cooling cycles gave reproducible values for each sample.

The total thermal conductivity ($\kappa_{tot}$) is the sum of the electronic ($\kappa_{ele}$) and lattice thermal conductivity ($\kappa_{lat}$). $\kappa_{ele}$ is proportional to the electrical conductivity ($\sigma$) through the Wiedemann-Franz relation[21], $\kappa_{ele} = L\sigma T$, where L is the Lorenz number. Due to the complexity and the non-parabolicity of the valence band structure around the Fermi level for p-type hole doped SnSe, accurate determination of L is difficult. Nevertheless, an estimation of L can be made using a single parabolic band model with acoustic phonon scattering[25]. We found good repeatability for the thermal diffusivity and $\kappa_{tot}$ as evidenced by multiple measurements along different crystallographic directions. The uncertainty of the thermal conductivity was estimated to be within 5%, considering the uncertainties for D, $C_p$ and $\rho$.

We found good experimental repeatability for the high ZT values of hole doped SnSe as evidenced by measurements on three separate crystals prepared independently. The combined uncertainty for all measurements involved in the calculation of ZT was around 15%. The $ZT_{ave}$ can be calculated by integrating the area under the ZT curve divided by the temperature difference based on the relationship[20, 21]:

$$ZT_{ave} = \frac{1}{T_h - T_c} \int_{T_c}^{T_h} ZT dT \qquad (3)$$

where $T_h$ and $T_c$ are the hot-side and the cold-side temperature, respectively.

Density Functional Theory (DFT) Calculations:

The total energies and relaxed geometries were calculated by DFT within the generalized gradient approximation of Perdew-Burke-Ernzerhof to the exchange correlation functional with Projector Augmented Wave potentials[33, 34]. We used periodic boundary conditions and plane wave basis sets as implemented in the Vienna ab initio simulation package[35]. The total energies were numerically converged to approximately 3 meV/cation with spin-orbit coupling using a basis set energy cutoff of 500 eV and dense k-meshes corresponding to 3000 per reciprocal atom k-points in the Brillouin zone. The crystal structure of SnSe has a Pnma space group at a temperature range of 300-790 K, with a=11.58 Å, b=4.22 Å, and c=4.40 Å. Our theoretically relaxed low-temperature SnSe lattice constants are respectively a=11.794 Å, b=4.215 Å, and c=4.550 Å, which are in good agreement with the experimental measurements.

On the basis of the band structure of Pnma phase as shown in FIG. 7C, the first valence band maximum (VBM) is at (0.0, 0.0, 0.35) along the Γ-Z direction of the first Brillouin zone. There is also a local valence-band maximum at (0.0, 0.0, 0.44) that lies 0.06 eV lower in energy than the first VBM. Based on these two maxima, the effective masses are calculated by fitting the actual E-k diagram around the VBM for the different directions, the effective mass m* is defined as:

$$m^* = \hbar^2 \left(\frac{\partial^2 E}{\partial k^2}\right)^{-1} \qquad (4)$$

where $\hbar$ is the reduced Planck constant.

In a multiband system where more than one type of band contributes to the thermoelectric performance the following expression may define the key materials parameters that contribute to $ZT$[18, 21, 36, 37]:

$$ZT_{max} \propto \tag{5}$$

$$\frac{T^{5/2}}{\kappa_{lat}} \exp\left(r + \frac{1}{2}\right)\left[\gamma_1 \tau_1 \sqrt{\frac{m_{x_1} \cdot m_{y_1}}{m_{z_1}}} + \gamma_2 \tau_2 \sqrt{\frac{m_{x_2} \cdot m_{y_2}}{m_{z_2}}} + \ldots \right]$$

where $\gamma_1$, $\gamma_2$ etc is the degeneracy of band extrema in the Brillouin zone for band 1, 2 etc, mi is the effective mass of the carriers (electrons or holes) in the $i^{th}$ crystal direction, $\tau_1$, $\tau_2$ is the relaxation time of the carriers moving along the transport (z) direction for each band, r is the scattering parameter, and $\kappa_{lat}$ is the lattice thermal conductivity. The degeneracy of band extrema ($\gamma$) in the Brillouin zone is the number of valleys in the conduction band (relevant to n-type materials) or peaks in the valence band (relevant to p-type materials). In the orthorhombic crystal symmetry of SnSe $\gamma=2$. In SnSe the presence of more than one type of band (each band with a $\gamma=2$) near the Fermi level leads to increased ZT because the total power factor for the material derives from the summation of contributions from all relevant bands.

In addition to $\gamma$, Eq. (5) also implies that high effective mass anisotropy (i.e. high ($m_x m_y/m_z$) ratio) is critical to high ZT. If transport is taken to be along the z-direction of the crystal, a small effective mass ($m_z$) along this direction coupled with large masses along the x- and y-directions ($m_x$ and $m_y$) is important. Taking the effective mass parameters $m_x$, $m_y$, $m_z$, from the DFT calculations we can assess the fractions ($m_x m_y/m_z$) for each band for each crystal direction. The high anisotropy in the crystal structure of SnSe gives rise to sqrt($m_x m_y/m_z$) ratios highest along the c- and b-directions (for all relevant valence bands). For example, for the first band (Γ-Z)sqrt ($m_x \cdot m_y/m_z$)=1.34 sqrt($m_0$) along the c-direction, 0.56 sqrt($m_0$) for the b-direction, and 0.25 sqrt($m_0$) for the a-direction, where $m_0$ is the free electron mass. For the 2nd band (Γ-Y) sqrt ($m_x \cdot m_y/m_z$)=1.62 sqrt($m_0$) for the c-direction, 1.72 sqrt($m_0$) b-direction, and 0.11 sqrt($m_0$) for the a-direction. This is consistent with the experimental fact that the b- and c-axes of the crystal are the high performance directions.

We have used Boltzmann theory to compute semi-classical values of the Seebeck coefficient and electrical conductivity from the DFT-computed electronic structure. We used the program Boltztrap for these calculations[38]. In these calculations, the electrical conductivity and Seebeck coefficient tensor are all integrated over all electronic states. Our calculations show that the Seebeck coefficient decreases with increasing carrier concentration. We assume that the low concentration case is related to a single band and multiband contributions become more prominent for higher hole concentrations. We see that as carrier concentration p increases, the Seebeck coefficient decreases significantly more slowly than the $p^{-2/3}$ dependence expected from a single parabolic band when the doping becomes sufficient to bring multiple bands into play. At 750K, as the hole concentration increases by a factor of 3 (from 2×19 cm$^{-3}$ to 6×19 cm$^{-3}$), a single band model would predict a decrease in the Seebeck coefficient from 380 μV/K to 190 μV/K. Our multiband calculations show a decrease from 380 μV/K to only 290 μV/K, hence a Seebeck coefficient significantly larger than this single band model.

Another more intuitive way to explain why heavily doped semiconductors with multiple band transport exhibit higher Seebeck coefficient than those with single band transport (with the same hole concentration) is given by the well-known equation (for a parabolic bands) below[11]:

$$\alpha = \frac{8\pi^2 k_B^2 T}{3eh^2} m_d^* \left(\frac{\pi}{3p}\right)^{2/3} \tag{6}$$

where $k_B$ is the Boltzmann constant, e the electron charge, h the Planck constant, T the Kelvin temperature, $m^*_d$ the density of states effective mass, and p the hole concentration. The density of states effective mass ($m^*_d$) resulting from multiple bands lying close in energy is higher than that from a single band. This results in an enhanced Seebeck coefficient[12, 27, 39, 40].

References for Example 2

1 Zhao, L. D. et al. Ultralow thermal conductivity and high thermoelectric figure of merit in SnSe crystals. *Nature* 508, 373-377 (2014).
2 Heremans, J. P., Dresselhaus, M. S., Bell, L. E. & Morelli, D. T. When thermoelectrics reached the nanoscale. *Nature Nanotechnol.* 8, 471-473 (2013).
3 Snyder, G. J. & Toberer, E. S. Complex thermoelectric materials. *Nature Mater.* 7, 105-114 (2008).
4 Zhao, L. D., Dravid, V. P. & Kanatzidis, M. G. The panoscopic approach to high performance thermoelectrics. *Energy Environ. Sci.* 7, 251-268 (2014).
5 Bell, L. E. Cooling, heating, generating power, and recovering waste heat with thermoelectric systems. *Science* 321, 1457-1461 (2008).
6 Sootsman, J. R., Chung, D. Y. & Kanatzidis, M. G. New and Old Concepts in Thermoelectric Materials. *Angew. Chem. Int. Edit.* 48, 8616-8639 (2009).
7 Dresselhaus, M. S. et al. New directions for low-dimensional thermoelectric materials. *Adv. Mater.* 19, 1043-1053 (2007).
8 Hsu, K. F. et al. Cubic AgPb$_m$SbTe$_{2+m}$: Bulk thermoelectric materials with high figure of merit. *Science* 303, 818-821 (2004).
9 Zhou, M., Li, J. F. & Kita, T. Nanostructured AgPb$_m$SbTe$_{m+2}$ system bulk materials with enhanced thermoelectric performance. *J. Am. Chem. Soc.* 130, 4527-4532 (2008).
10 Poudeu, P. F. R. et al. High thermoelectric figure of merit and nanostructuring in bulk p-type Na$_{1-x}$Pb$_m$Sb$_y$Te$_{m+2}$. *Angew. Chem. Int. Edit.* 45, 3835-3839 (2006).
11 Heremans, J. P. et al. Enhancement of thermoelectric efficiency in PbTe by distortion of the electronic density of states. *Science* 321, 554-557 (2008).
12 Pei, Y. Z. et al. Convergence of electronic bands for high performance bulk thermoelectrics. *Nature* 473, 66-69 (2011).
13 Liu, W. et al. Convergence of Conduction Bands as a Means of Enhancing Thermoelectric Performance of n-Type Mg$_2$Si$_{1-x}$Sn$_x$ Solid Solutions. *Phys. Rev. Lett.* 108, 166601 (2012).
14 Zhao, H. Z. et al. High thermoelectric performance of MgAgSb-based materials. *Nano Energy* 7, 97-103 (2014).
15 Biswas, K. et al. High-performance bulk thermoelectrics with all-scale hierarchical architectures. *Nature* 489, 414-418 (2012).
16 Zhao, L. D. et al. High Thermoelectric Performance via Hierarchical Compositionally Alloyed Nanostructures. *J. Am. Chem. Soc.* 135, 7364-7370 (2013).
17 Shi, X. et al. Multiple-Filled Skutterudites: High Thermoelectric Figure of Merit through Separately Optimizing Electrical and Thermal Transports. *J. Am. Chem. Soc.* 133, 7837-7846 (2011).

18 Ravich, Y. I., Efimova, B. A. & Smirnov, I. A. *Semiconducting Lead Chalcogenides*. Vol. 5 (Plenum press, 1970).
19 Wu, H. J. et al. Broad temperature plateau for thermoelectric figure of merit ZT>2 in phase-separated PbTe$_{0.7}$S$_{0.3}$. *Nature Commun.* 5, 4515 (2014).
20 Yang, J. H. & Stabler, F. R. Automotive Applications of Thermoelectric Materials. *J. Electron. Mater.* 38, 1245-1251 (2009).
21 Rowe, D. M. *CRC Handbook of Thermoelectrics*. (CRC Press, 1995).
22 Poudel, B. et al. High-thermoelectric performance of nanostructured bismuth antimony telluride bulk alloys. *Science* 320, 634-638 (2008).
23 Callaway, J. & Vonbaeyer, H. C. Effect of Point Imperfections on Lattice Thermal Conductivity. *Phys. Rev.* 120, 1149-1154 (1960).
24 Wang, H., Pei, Y. Z., LaLonde, A. D. & Snyder, G. J. Heavily Doped p-Type PbSe with High Thermoelectric Performance: An Alternative for PbTe. *Adv. Mater.* 23, 1366-1370 (2011).
25 Zhao, L. D. et al. Thermoelectrics with Earth Abundant Elements: High Performance p-type PbS Nanostructured with SrS and CaS. *J. Am. Chem. Soc.* 134, 7902-7912 (2012).
26 Tan, G. J. et al. High Thermoelectric Performance of p-Type SnTe via a Synergistic Band Engineering and Nanostructuring Approach. *J. Am. Chem. Soc.* 136, 7006-7017 (2014).
27 Pei, Y. Z., Wang, H. & Snyder, G. J. Band Engineering of Thermoelectric Materials. *Adv. Mater.* 24, 6125-6135 (2012).
28 Dalven, R. *Solid State Physics*. Vol. 28, 179 (Plenum press, 1973).
29 Shi, G. & Kioupakis, E. Quasiparticle band structures and thermoelectric transport properties of p-type SnSe. arXiv:1406.1218, 2014.
30 Chen, C. L., Wang, H., Chen, Y. Y., Day, T. & Snyder, G. J. Thermoelectric properties of p-type polycrystalline SnSe doped with Ag. *J. Mater. Chem. A* 2, 11171-11176, (2014).
31 Sassi, S. et al. Assessment of the thermoelectric performance of polycrystalline p-type SnSe. *Appl. Phys. Lett.* 104, 212105 (2014).
32 Pashinkin, A. S., Malkova, A. S., Fedorov, V. A. & Mikhailova, M. S. Heat capacity of tin monoselenide. *Inorg. Mater.* 42, 593-595 (2006).
33 Blochl, P. E. projector augmented-wave method. *Phys. Rev. B* 50, 17953 (1994).
34 Perdew, J. P., Burke, K. & Ernzerhof, M. Generalized Gradient Approximation Made Simple. *Phys. Rev. Lett.* 77, 3865 (1996).
35 Kresse, G. & Furthmüller, J. Efficient iterative schemes for ab initio total-energy calculations using a plane-wave basis set. *Phys. Rev. B* 54, 11169 (1996).
36 Goldsmid, H. J. *Thermoelectric Refrigeration*. (Plenum Press, 1964), p. 58.
37 Dresselhaus, M. S., Lin, Y.-M., Cronin, S. B., Rabin, O., Black, M. R. & Dresselhaus, G. Quantum wells and quantum wires for potential thermoelectric applications, in *Recent Trends in Thermoelectric Materials Research III*, Editor: T. M. Tritt, (Academic Press, 2001), p. 1-121.
38 Madsen, G. K. H. & Singh, D. J. BoltzTraP. A code for calculating band-structure dependent quantities. *Comp. Phys. Commun.* 175, 67-71 (2006).
39 Kolomoet, N. V., Vinograd, M. N. & Sysoeva, L. M. *Soviet Physics Semiconductors-USSR* 1, 1020 (1968).
40 Heremans, J. P., Wiendlocha, B. & Chamoire, A. M. Resonant levels in bulk thermoelectric semiconductors. *Energy Environ Sci.* 5, 5510-5530 (2012).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A thermoelectric material having a length and comprising SnSe single crystals having an a-axis, a b-axis and a c-axis, wherein not all crystalline orientations of the SnSe single crystals are represented equally along the length of the material, such that SnSe single crystals oriented along their b-axial direction or their c-axial direction, as defined with respect to the room temperature crystal structure of the SnSe, are selectively favored relative to those oriented along their a-axial direction; and further wherein the thermoelectric material has a $ZT_{max}$ value of at least about 1.3 at a temperature of greater than 800 K, as measured along the length of the thermoelectric material.

2. The material of claim 1 having a $ZT_{max}$ value of at least 1.4 at a temperature of 973 K, as measured along the length of the material.

3. The material of claim 1, wherein greater than 80% of the SnSe single crystals are oriented, to within ±10°, along their b-axial direction along the length of the material, as defined with respect to the room temperature crystal structure of the SnSe, and the thermoelectric material has a $ZT_{max}$ value of at least about 2 at a temperature of greater than 800 K, as measured along the length of the material.

4. The material of claim 1, wherein greater than 90% of the SnSe single crystals are oriented, to within ±5°, along their b-axial direction along the length of the material, as defined with respect to the room temperature crystal structure of the SnSe, and the thermoelectric material has a $ZT_{max}$ value of at least about 2 at a temperature of greater than 800 K, as measured along the length of the material.

5. The material of claim 1, wherein the thermoelectric material consists of SnSe single crystals.

6. The material of claim 1, wherein the SnSe single crystals are extrinsically p-type doped and the material has a $ZT_{max}$ value of at least 1.4 at a temperature of 600 K, as measured along the length of the material.

7. The material of claim 6, wherein the material has a $ZT_{ave}$ value of at least 2 over the temperature range from 300 K to 923 K, as measured along the length of the material.

8. The material of claim 7, wherein the SnSe single crystals have a hole concentration of at least $1\times10^{19}$ cm$^{-3}$.

9. The material of claim 7, wherein the SnSe single crystals are doped with sodium and have a hole concentration in the range from about $1\times10^{19}$ cm$^{-3}$ to about $1\times10^{20}$ cm$^{-3}$.

10. A thermoelectric cell comprising:
a thermoelectric material having a length defined between a first end and a second end, the thermoelectric material comprising SnSe single crystals having an a-axis, a b-axis and a c-axis, wherein not all crystalline orientations of the SnSe single crystals are represented equally along the length of the material, such that SnSe single crystals oriented along their b-axial direction or their c-axial direction, as defined with respect to the room temperature crystal structure of the SnSe, are selectively favored relative to those oriented along their a-axial direction; and further wherein the thermoelectric material has a $ZT_{max}$ value of at least about 1.3 at a temperature of greater than 800 K, as measured along the length of the thermoelectric material;
a first contact comprising a thermally and electrically conductive material at the first end of the thermoelectric material; and
a second contact comprising a thermally and electrically conductive material at the second end of the thermoelectric material.

11. The cell of claim 10, wherein the material has a $ZT_{max}$ value of at least 1.4 at a temperature of 973 K, as measured along the length of the material.

12. The cell of claim 10, wherein greater than 80% of the SnSe single crystals in the thermoelectric material are oriented, to within ±10°, along their b-axial direction along the length of the thermoelectric material, as defined with respect to the room temperature crystal structure of the SnSe, and the thermoelectric material has a $ZT_{max}$ value of at least about 2 at a temperature of greater than 800 K, as measured along the length of the material.

13. The cell of claim 10, wherein the SnSe single crystals are extrinsically p-type doped and the thermoelectric material has a $ZT_{max}$ value of at least 2 at a temperature of 600 K, as measured along the length of the material.

14. A method of powering an external device using a thermoelectric cell comprising:
a thermoelectric material comprising an SnSe powder comprising SnSe single crystals and having a first end and a second end, wherein the thermoelectric material has a $ZT_{max}$ value of at least about 1.3 at a temperature of greater than 800 K, as measured between the first end and the second end;
a first contact comprising a thermally and electrically conductive material at the first end; and
a second contact comprising a thermally and electrically conductive material at the second end;
the method comprising:
connecting an external electrical device to the thermoelectric cell; and
exposing the thermoelectric material to a temperature gradient between its first end and its second end that results in the generation of electricity in the thermoelectric material, wherein the external electrical device is powered by the electricity.

15. The method of claim 14, wherein the SnSe single crystals have an a-axis, a b-axis, and a c-axis and not all crystalline orientations of the SnSe single crystals are represented equally along the length of the material, such that SnSe single crystals oriented along their b-axial direction or their c-axial direction, as defined with respect to the room temperature crystal structure of the SnSe, are selectively favored relative to those oriented along their a-axial direction; and further wherein the thermoelectric material has a $ZT_{max}$ value of at least about 1.3 at a temperature of greater than 800 K, as measured along the length of the material.

16. The method of claim 14, wherein the thermoelectric cell is operated at a temperature of at least 800 K.

17. The method of claim 14, wherein the thermoelectric material has a $ZT_{max}$ value of at least 1.4 at a temperature of 973 K, as measured along the length of the material.

18. The method of claim 14, wherein greater than 80% of the SnSe single crystals in the thermoelectric material are oriented, to within ±10°, along their b-axial direction along the length of the thermoelectric material, as defined with respect to the room temperature crystal structure of the SnSe, and the thermoelectric material has a $ZT_{max}$ value of at least about 2 at a temperature of greater than 800 K, as measured along the length of the material.

19. The method of claim 14, wherein the SnSe single crystals are extrinsically p-type doped and the thermoelectric material has a $ZT_{max}$ value of at least 1.4 at a temperature of 600 K, as measured along the length of the material.

20. A method of powering an external device using a thermoelectric cell comprising:
a thermoelectric material consisting essentially of SnSe single crystals and having a first end and a second end, wherein the thermoelectric material has a $ZT_{max}$ value of at least about 1.3 at a temperature of greater than 800 K, as measured between the first end and the second end;
a first contact comprising a thermally and electrically conductive material at the first end; and
a second contact comprising a thermally and electrically conductive material at the second end;
the method comprising:
connecting an external electrical device to the thermoelectric cell; and
exposing the thermoelectric material to a temperature gradient between its first end and its second end that results in the generation of electricity in the thermoelectric material, wherein the external electrical device is powered by the electricity.

* * * * *